US010032923B2

(12) United States Patent
Moon et al.

(10) Patent No.: US 10,032,923 B2
(45) Date of Patent: Jul. 24, 2018

(54) METAL OXIDE THIN FILM, METHOD FOR MANUFACTURING THE SAME, AND SOLUTION FOR METAL OXIDE THIN FILM

(75) Inventors: Jooho Moon, Seoul (KR); Youngmin Jeong, Incheon (KR); Tae Hwan Jun, Gyeonggi-do (KR); Keun Kyu Song, Gyeonggi-do (KR); Areum Kim, Gyeonggi-do (KR); Yangho Jung, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 1646 days.

(21) Appl. No.: 14/127,562

(22) PCT Filed: Mar. 4, 2011

(86) PCT No.: PCT/KR2011/001506
§ 371 (c)(1),
(2), (4) Date: Nov. 5, 2014

(87) PCT Pub. No.: WO2011/108884
PCT Pub. Date: Sep. 9, 2011

(65) Prior Publication Data
US 2015/0137115 A1 May 21, 2015

(30) Foreign Application Priority Data

Mar. 5, 2010 (KR) .......................... 10-2010-0019634
Feb. 25, 2011 (KR) .......................... 10-2011-0016949

(51) Int. Cl.
*H01L 29/786* (2006.01)
*H01L 21/02* (2006.01)
*H01L 21/477* (2006.01)
*H01L 29/66* (2006.01)
*C23C 18/12* (2006.01)
*H01L 31/0224* (2006.01)
*C09D 1/00* (2006.01)
*C09D 7/61* (2018.01)

(52) U.S. Cl.
CPC ............ *H01L 29/7869* (2013.01); *C09D 1/00* (2013.01); *C09D 7/61* (2018.01); *C23C 18/1208* (2013.01);
(Continued)

(58) Field of Classification Search
CPC . H01L 29/7869; H01L 21/02422; C09D 5/00; C23C 18/1208
See application file for complete search history.

(56) References Cited

U.S. PATENT DOCUMENTS 8,679,587 B2   3/2014   Chang et al.
2009/0173938 A1   7/2009   Honda et al.

FOREIGN PATENT DOCUMENTS

JP   S6278106 A   4/1987
JP   2005-008511 A   1/2005
(Continued)

OTHER PUBLICATIONS

International Search Report issued in corresponding application No. PCT/KR2011/001506 dated Dec. 23, 2011.
(Continued)

*Primary Examiner* — Melvin C Mayes
*Assistant Examiner* — Stefanie J Cohen
(74) *Attorney, Agent, or Firm* — Carter, DeLuca, Farrell & Schmidt, LLP

(57) ABSTRACT

The present disclosure provides a solution for a metal oxide semiconductor thin film, including metal hydroxides dissolved in an aqueous or nonaqueous solvent and an acid/base titrant for controlling solubility of metal hydroxides. A solution is synthesized to improve stability and semiconductive performance of a device through addition of other metal hydroxides. The solution is applied on a substrate and annealed by using various annealing apparatuses to obtain a high-quality metal oxide thin film at low temperatures. The thin film is optically transparent, and thus can be applied to thin films for various electronic devices, solar cells, various sensors, memory devices, and the like.

27 Claims, 16 Drawing Sheets

(52) U.S. Cl.
CPC ...... *C23C 18/1216* (2013.01); *C23C 18/1275* (2013.01); *C23C 18/1279* (2013.01); *C23C 18/1283* (2013.01); *C23C 18/1287* (2013.01); *H01L 21/02422* (2013.01); *H01L 21/02554* (2013.01); *H01L 21/02565* (2013.01); *H01L 21/02628* (2013.01); *H01L 21/477* (2013.01); *H01L 29/66969* (2013.01); *H01L 31/022466* (2013.01)

(56) References Cited

FOREIGN PATENT DOCUMENTS

| | | | |
|---|---|---|---|
| JP | 2008-222467 A | | 9/2008 |
| JP | 2008-248136 A | | 10/2008 |
| JP | 2008-288196 A | | 11/2008 |
| JP | 2009-167095 A | | 7/2009 |
| JP | 2011134495 A | * | 7/2011 |
| KR | 10-2001-0101560 A | | 11/2001 |
| KR | 10-2002-0096534 A | | 12/2002 |
| KR | 10-0891952 B1 | | 4/2009 |
| KR | 10-2009-0102899 A | | 10/2009 |
| KR | 10-2009-0110193 A | | 10/2009 |
| KR | 20100120295 A | | 11/2010 |

OTHER PUBLICATIONS

International Preliminary Report on Patentability and Written Opinion issued in corresponding application No. PCT/KR2011/001506 dated Sep. 11, 2012.

* cited by examiner (a) (b)

(c)

(a)

(b)

(a)

(b)

(a)

(b)

(a)

(b)

(a)

(b)

(c)

(d)

(a)

(b)

(c)

(d)

(a)

(b)

(c)

(a)

(b)

(c)

(a)

(b)

(a)

(b)

(c)

(a)

(b)

(c)

(a)

(b)

(c)

METAL OXIDE THIN FILM, METHOD FOR MANUFACTURING THE SAME, AND SOLUTION FOR METAL OXIDE THIN FILM

CROSS-REFERENCE TO RELATED APPLICATIONS

This U.S. non-provisional patent application is a national stage entry of International Application No. PCT/KR2011/001506 filed Mar. 4, 2011, which claims priority to Korean Patent Applications No. 10-2010-0019634, filed on Mar. 5, 2010 and No. 10-2011-0016949 filed on Feb. 25, 2011, the disclosure of which is hereby incorporated by reference in its entirety.

TECHNICAL FIELD

The subject matter disclosed herein relates to a metal oxide thin film and a method for manufacturing the same, and more particularly, to a solution for a metal oxide thin film used to implement a transparent electronic device by using low temperature annealing, a metal oxide thin film formed using the same, and a method for manufacturing the same.

BACKGROUND ART

In accordance with an increase in demand and interest for a thin film type display such as a liquid crystal display and an organic light emitting diode, recently, an effort to obtain devices having a favorable quality has rapidly grown. Silicon-based semiconductor device materials have been mainly studied as display driving devices.

Silicon has merits in terms of physical properties, lifespan, and performance stability, but requires vacuum deposition and laser annealing processes to form a thin film, and thus a high-cost apparatus for the processes increases a manufacturing cost. Accordingly, recently, an effort to use a metal oxide material in a semiconductor channel layer has been conducted, and metal oxides have a possibility of a transparent device.

A thin film transistor device is basically formed of a semiconductor material, an electrode material, and a dielectric material, and recently, a study has been conducted to apply metal oxides, which is transparent in a visible ray region, to constituent elements of this representative device, thus forming a new concept device such as a transparent transistor, a transparent memory, and a transparent electrode. Inorganic zinc oxide (ZnO) as a representative transparent semiconductor material receives large attention in view of use in a channel layer of an active region in a thin film transistor due to a wide energy band gap and excellent light transmission, and zirconia ($ZrO_2$), alumina ($Al_2O_3$), silica ($SiO_2$), and titania ($TiO_2$) are frequently used as an insulating layer material in the thin film transistor due to a high insulating characteristic. Further, oxides of metal such as indium or tin are transparent and have high conductivity, and thus are frequently studied as a transparent electrode material of an electrode of a transistor and a touch screen.

Despite the excellent characteristics, there are drawbacks in that a high-cost vacuum process such as sputtering and pulse laser deposition (PLD) is required to form the oxide thin film. Accordingly, a solution-based technology as a low-cost manufacturing process where mass production is feasible, that is, a method for manufacturing the thin film transistor using methods such as spin coating, inkjet printing, offset printing, and gravure printing is required. A precursor material used in the solution process should have performance suitable for each constituent element of the thin film transistor, for example, a semiconductor material should have high mobility, an excellent switching characteristic, and a high on/off ratio ($I_{on/off}$), an insulating layer should have a high insulating ability and an appropriate dielectric constant, and an electrode material should have high conductivity and low specific resistance. Additionally, if transparency is maintained while each constituent element is formed at low temperatures, an innovative method for manufacturing a transistor even on a transparent polymer substrate in addition to glass by a solution process to implement a flexible transparent transistor may be provided.

Particularly, the aforementioned required characteristics needs to be obtained under low temperature annealing at about 350° C. or less to implement a high-quality device. However, oxide thin films having excellent characteristics by low temperature annealing using a material in a solution state, and manufacturing of the thin film transistor by combining the oxide thin films very sensitively depend on a composition of a solution, and an annealing temperature and an annealing method after coating. The solution is generally constituted by a precursor (organic metal and metal salts) forming metal oxides, a solvent dissolving the precursor, a stabilizer for improving solubility (complexing agent), and other additives for controlling a coating property and viscosity. There is a difference in chemical decomposition reaction process and reaction temperature according to a type of used precursor, thereby determining crystallinity and purity of the formed oxide thin film, and a decomposition temperature and a residual amount of an organic material are determined according to a type of stabilizer and other additives. Generally, in the case of a sol-gel method and a metal-organic compound solution method (metallorganic deposition, MOD) using a metal-organic compound, metal alkoxide, and metal salts, since decomposition of the precursor and an oxide generation reaction mostly require a high temperature of about 400° C. or more, it is difficult to apply the sol-gel method and the metal-organic compound solution method to a low-temperature type flexible substrate, and in the case of a glass substrate which can be used at relatively high temperatures, since bending and separation occur, misalignment and cracks are formed during a subsequent process. Accordingly, currently, annealing is performed in advance before a semiconductor process through a pre-compaction process, but there are limitations in that this process is an additional process and is difficult to be applied to a large-sized glass substrate.

A typical conventional method for manufacturing an oxide semiconductor is a vacuum deposition, and currently, there are many reports regarding a sol-gel method, a colloidal particle method, and an organometallic deposition method, but these methods require annealing and post-treatment processes at about 400° C. or more.

Meanwhile, in the case of the oxide semiconductor, transition metal added to the oxide semiconductor may be reduced to increase a carrier concentration and oxygen defects in a thin film. Accordingly, transition metal serves to increase conductivity of the thin film to become an alternative for overcoming a limitation of mobility, but when positive bias stress is continuously applied, that is, when a positive gate voltage is continuously applied or a voltage is repeatedly applied to perform driving, there is a limitation in that a threshold voltage of the device is significantly changed in a positive direction. Further, in the case of a typical display such as LCD and OLED, when a negative gate voltage is continuously applied in the device in an off state, heat is generated, and thus there is a limitation in that the threshold voltage is changed in a negative direction.

This unstable characteristic causes a very large limitation in views of stability of the transistor performing a switching role, and thus the typical display has physical properties that are difficult to be applied to devices in practice.

DISCLOSURE OF THE INVENTION

Technical Problem

The present disclosure provides a semiconductive oxide thin film having improved stability to bias (electric field) stress and heat generation stress due to a negative voltage.

The present disclosure also provides a metal oxide thin film formed at low temperatures by a simple process.

The present disclosure also provides a novel solution for a metal oxide thin film used to manufacture a semiconductor thin film by a solution process, and a method for manufacturing the same.

The present disclosure also provides a method for manufacturing an optically transparent thin film on a flexible substrate.

The present disclosure also provides a method for manufacturing an electronic device such as a thin film transistor by a low temperature solution process at about 350° C. or less, for example, about 250° C. to about 350° C.

The present disclosure also provides a method for manufacturing an electronic device having high performance and high stability by a simple process at low temperatures.

Technical Solution

Other aspects and technical characteristics of the present disclosure will be discussed in more detail in the following detailed description.

Embodiments of the present disclosure provide compositions for an oxide thin film, the composition comprising a metal hydroxide, and an acid/base titrant for controlling solubility of the metal hydroxide, wherein a concentration of the metal hydroxide is about 0.05 mol/L to about 40 mol/L.

In some embodiments, the acid/base titrant may be selected from ammonia, tetramethylammonium hydroxide, methylamine, urea, an acetic acid, a hydrochloric acid, a nitric acid, a sulfuric acid, hydrogen peroxide, and a combination thereof In other embodiments, the metal hydroxide may include a first metal hydroxide selected from aluminum hydroxide ($Al(OH)_3$), zinc hydroxide ($Zn(OH)_2$), gallium hydroxide ($Ga(OH)_3$), indium hydroxide ($In(OH)_3$), tin hydroxide ($Sn(OH)_4$), and a combination thereof.

In still other embodiments, the metal hydroxide may include a first metal hydroxide selected from aluminum hydroxide ($Al(OH)_3$), zinc hydroxide ($Zn(OH)_2$), gallium hydroxide ($Ga(OH)_3$), indium hydroxide ($In(OH)_3$), tin hydroxide ($Sn(OH)_4$), and a combination thereof, and a second metal hydroxide selected from yttrium hydroxide ($Y(OH)_3$), zirconium hydroxide ($Zr(OH)_4$), hafnium hydroxide ($Hf(OH)_4$), scandium hydroxide ($Sc(OH)_3$), gallium hydroxide ($Ga(OH)_3$), lanthanum hydroxide ($La(OH)_3$), and a combination thereof to improve bias stability.

In even other embodiments, the first metal hydroxide and the second metal hydroxide may be contained at a mol ratio of about 1:0 to 0.2.

In yet other embodiments, the first metal hydroxide and the second metal hydroxide may be contained at a mol ratio of about 1:0 to 0.02.

In further embodiments, the metal hydroxide may further include the first metal hydroxide selected from aluminum hydroxide ($Al(OH)_3$), zinc hydroxide ($Zn(OH)_2$), gallium hydroxide ($Ga(OH)_3$), indium hydroxide ($In(OH)_3$), tin hydroxide ($Sn(OH)_4$), and a combination thereof, the second metal hydroxide selected from yttrium hydroxide ($Y(OH)_3$), zirconium hydroxide ($Zr(OH)_4$), hafnium hydroxide ($Hf(OH)_4$), scandium hydroxide ($Sc(OH)_3$), gallium hydroxide ($Ga(OH)_3$), lanthanum hydroxide ($La(OH)_3$), and a combination thereof to improve bias stability, and a third metal hydroxide selected from lithium hydroxide ($Li(OH)$, titanium hydroxide ($Ti(OH)$), and a combination thereof to improve performance at low temperatures.

In still further embodiments, the first metal hydroxide, the second metal hydroxide, and the third metal hydroxide may be contained at a mol ratio of about 1:0 to 0.2:0 to 0.2.

In even further embodiments, the first metal hydroxide, the second metal hydroxide, and the third metal hydroxide may be contained at a mol ratio of about 1:0 to 0.02:0 to 0.02.

In yet further embodiments, the metal hydroxide may include the first metal hydroxide selected from aluminum hydroxide ($Al(OH)_3$), zinc hydroxide ($Zn(OH)_2$), gallium hydroxide ($Ga(OH)_3$), indium hydroxide ($In(OH)_3$), tin hydroxide ($Sn(OH)_4$), and a combination thereof, and the third metal hydroxide selected from lithium hydroxide ($Li(OH)$, titanium hydroxide ($Ti(OH)$), and a combination thereof to improve performance at low temperatures.

In much further embodiments, the first metal hydroxide and the third metal hydroxide may be contained at a mol ratio of about 1:0 to 0.2.

In still much further embodiments, the first metal hydroxide and the third metal hydroxide may be contained at a mol ratio of about 1:0 to 0.02.

In even much further embodiments, the metal hydroxide may include a fourth metal hydroxide selected from zirconium hydroxide ($Zr(OH)_4$), hafnium hydroxide ($Hf(OH)_4$), aluminum hydroxide ($Al(OH)_3$), yttrium hydroxide ($Y(OH)_3$), gadolinium hydroxide ($Gd(OH)_3$), lanthanum hydroxide ($La(OH)_3$), and a combination thereof.

In other embodiments of the present disclosure, methods for forming an oxide thin film comprise applying a composition for the oxide thin film comprising a metal hydroxide dissolved in an aqueous or nonaqueous solvent and an acid/base titrant for controlling solubility of the metal hydroxide to a substrate, and annealing the substrate on which the composition is applied.

In some embodiments, the annealing may be performed in a vacuum or reduction atmosphere at about 100° C. to about 350° C.

In other embodiments, the substrate may be a flexible substrate, a transparent substrate, or a glass substrate.

In still other embodiments, the annealing may be performed by using a hot plate, a convection oven, a box furnace, or a microwave.

In still other embodiments of the present disclosure, a metal oxide thin film is formed by applying a composition for an oxide thin film including a metal hydroxide dissolved in an aqueous or nonaqueous solvent and an acid/base titrant for controlling solubility of the metal hydroxide on a substrate, and performing annealing.

In some embodiments, the substrate may be a flexible substrate, a transparent substrate, or a glass substrate.

In other embodiments, the metal oxide thin film may be used as an active layer of a thin film transistor.

In even other embodiments of the present disclosure, a composition for an oxide thin film comprises a first metal hydroxide selected from aluminum hydroxide ($Al(OH)_3$), zinc hydroxide ($Zn(OH)_2$), gallium hydroxide ($Ga(OH)_3$), indium hydroxide ($In(OH)_3$), tin hydroxide ($Sn(OH)_4$), and a combination thereof, a second metal hydroxide selected from yttrium hydroxide ($Y(OH)_3$), zirconium hydroxide ($Zr(OH)_4$), hafnium hydroxide ($Hf(OH)_4$), scandium hydroxide ($Sc(OH)_3$), gallium hydroxide ($Ga(OH)_3$), lanthanum hydroxide ($La(OH)_3$), and a combination thereof, a third metal hydroxide selected from lithium hydroxide (Li(OH)), titanium hydroxide (Ti(OH)), and a combination thereof, and an acid/base titrant for controlling solubility of the first to third metal hydroxides, wherein a total concentration of the first to third metal hydroxides is about 0.05 mol/L to about 10 mol/L.

In some embodiments, the first metal hydroxide, the second metal hydroxide, and the third metal hydroxide may be contained at a mol ratio of about 1:0 to 0.2:0 to 0.2.

In other embodiments, the first metal hydroxide, the second metal hydroxide, and the third metal hydroxide may be contained at a mol ratio of about 1:0 to 0.02:0 to 0.02.

In still other embodiments, the acid/base titrant may be selected from ammonia, tetramethylammonium hydroxide, methylamine, urea, an acetic acid, a hydrochloric acid, a nitric acid, a sulfuric acid, hydrogen peroxide, and a combination thereof.

In yet other embodiments of the present disclosure, a metal oxide thin film includes a first metal selected from aluminum, zinc, gallium, indium, tin, and a combination thereof, a second metal selected from yttrium, zirconium, hafnium, scandium, gallium, lanthanum, and a combination thereof, and a third metal selected from lithium, titanium, and a combination thereof, wherein the first metal, the second metal, and the third metal are contained at an atomic number ratio of about 1:0 to 0.2:0 to 0.2.

In some embodiments, the first metal, the second metal, and the third metal may be contained at an atomic number ratio of about 1:0 to 0.02:0 to 0.02.

Advantageous Effects

According to the present disclosure, semiconductor, insulator, and conductor thin films constituting an electronic device may be formed by using a metal hydroxide through a simple process at low temperatures, and printing, spinning, and coating methods may be used as a thin film forming method.

Thin film transistors, solar cells, and various sensors and memory devices may be manufactured by using the present disclosure.

According to the present disclosure, various electronic devices can be embodied only by a solution process to significantly reduce a manufacturing cost of the electronic device, and particularly, a flexible device and an optically transparent electronic device can be embodied.

A semiconductive oxide thin film according to the present disclosure can effectively supplement drawbacks of a reduction in stability and reproducibility of a device due to application of an electric field to have operation stability and excellent semiconductor physical properties simultaneously.

According to the present disclosure, when Y, Zr, Hf, Sc, Ga, or La is added, movement of a threshold voltage in a negative direction due to heat generated when a negative bias electric field is applied can be effectively controlled, and thus semiconductor device has an excellent performance.

Further, when metal (Li, Ti) is added to improve performance, high performance can be obtained even at low temperatures.

MODE FOR CARRYING OUT THE INVENTION

Figure 1:
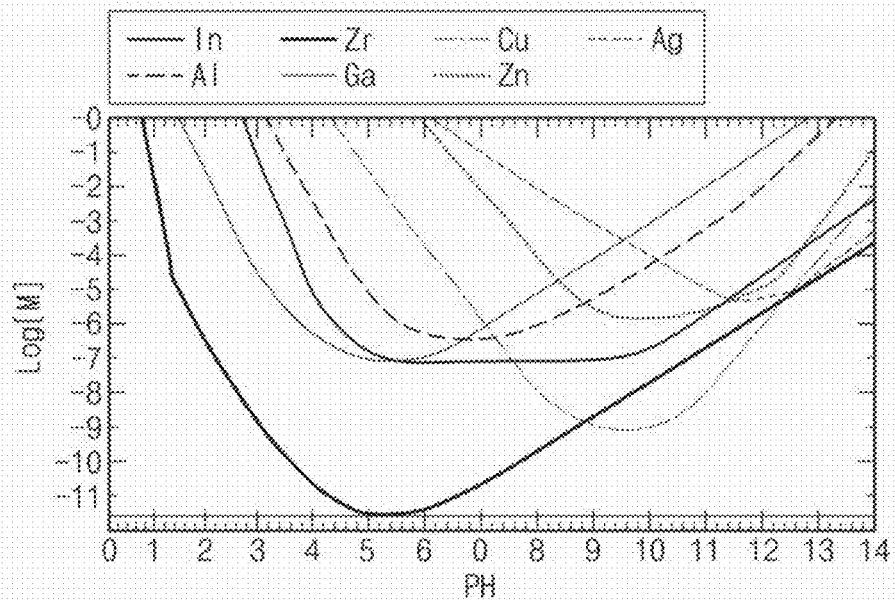
FIG. 1 is a graph showing a change in solubility to various metal elements according to the degree of acidity or basicity (pH)

Embodiments of the present disclosure propose a transparent oxide thin film which may have semiconductor, insulator, or conductor behavior through a low temperature process by using a metal hydroxide that is close to oxides and does not generate a residual organic material as a starting material when the thin film is formed by a solution method, and a method for forming the same.

Aluminum hydroxide ($Al(OH)_3$), zinc hydroxide ($Zn(OH)_2$), gallium hydroxide ($Ga(OH)_3$), indium hydroxide ($In(OH)_3$), tin hydroxide ($Sn(OH)_4$), or a combination thereof may be used as the metal hydroxide for forming the oxide semiconductor thin film. The metal hydroxide for a semiconductor may be contained at a concentration of about 0.05 mol/L to about 40 mol/L, about 0.05 mol/L to about 20 mol/L, or about 0.05 mol/L to about 10 mol/L.

Yttrium, zirconium, hafnium, scandium, gallium, lanthanum, or a combination thereof may be added for bias and/or temperature stability of the semiconductor thin film. Performance instability of the oxide semiconductor thin film according to positive bias stress, negative bias, and/or a temperature (fluctuation in threshold voltage according to application of a voltage and heat) may be relieved and/or removed according to addition of yttrium, zirconium, hafnium, scandium, gallium, and lanthanum elements, providing a stable semiconductor characteristic.

Further, lithium, titanium, or a combination thereof may be added for high performance of the semiconductor thin film. A high performance semiconductor device may be manufactured by addition thereof.

A stable semiconductor having high performance may be manufactured through addition of two types of metal elements (e.g., one metal element for improving stabilization: Y, Zr, Hf, Sc, Ga, and La and another metal element for improving performance: Li and Ti). The two types of elements may be contained in a content of about 0 mol to about 2 mol or about 0 mol to about 20 mol based on about 100 mol of the metal hydroxide for the semiconductor, such as aluminum hydroxide ($Al(OH)_3$), zinc hydroxide ($Zn(OH)_2$), gallium hydroxide ($Ga(OH)_3$), indium hydroxide ($In(OH)_3$), and tin hydroxide ($Sn(OH)_4$). For example, when the two types of elements are contained in a content of more than about 20 mol based on about 100 mol of zinc hydroxide, the elements may be precipitated.

Yttrium, zirconium, hafnium, scandium, gallium, and lanthanum elements may be added in a hydroxide form. In the case of yttrium hydroxide ($Y(OH)_3$), zirconium hydroxide ($Zr(OH)_4$), hafnium hydroxide ($Hf(OH)_4$), scandium hydroxide ($Sc(OH)_3$), gallium hydroxide ($Ga(OH)_3$), and/or lanthanum hydroxide ($La(OH)_3$) proposed in the present disclosure, a semiconductor layer is stabilized due to the Y, Zr, Hf, Sc, Ga, and/or La elements relatively strongly ionic-bonded to oxygen as compared to the Zn, Sn, and In elements and thus not significantly influenced by stress due to positive and negative biases and/or heat, accordingly, even when a gate voltage is applied for a long time or repeatedly applied, and/or heat is applied, a change in threshold voltage is significantly reduced.

Further, the present inventors confirmed that in the case of lithium hydroxide ($Li(OH)$) and/or titanium hydroxide ($Ti(OH)$), when the Li and/or Ti metal element was added in a predetermined amount, the number of electron carriers was increased, thereby improving device performance.

Meanwhile, zirconium hydroxide ($Zr(OH)_4$), hafnium hydroxide ($Hf(OH)_4$), aluminum hydroxide ($Al(OH)_3$), yttrium hydroxide ($Y(OH)_3$), gadolinium hydroxide ($Gd(OH)_3$), lanthanum hydroxide ($La(OH)_3$), or a combination thereof may be used as the metal hydroxide to form an insulator thin film.

Meanwhile, zinc hydroxide ($Zn(OH)_2$), indium hydroxide ($In(OH)_3$), tin hydroxide ($Sn(OH)_4$), aluminum hydroxide ($Al(OH)_3$), or a combination thereof may be used as the metal hydroxide to form a conductor thin film.

The inventors of the present disclosure confirmed that most metal hydroxides corresponding to metal oxides required in a transparent electronic device can be dissolved under an acidic or basic condition without a stabilizer, and the thin film manufactured therefrom can be changed into the corresponding metal oxides at relatively low temperatures, for example, at about 200° C. to about 250° C.

Further, in the present disclosure, microwave annealing may be used to perform the aforementioned change reaction at extremely low temperatures (about 140° C.), and thus the metal hydroxide may selectively and effectively absorb microwave energy to promote a change into oxides. Accordingly, a flexible transparent electronic device may be embodied on even a plastic substrate.

Particularly, in the present disclosure, the thin film having semiconductive, insulating, and/or conductive behavior may be manufactured by directly using the metal hydroxide having a high purity as the starting material without a precipitation process from a metal salt.

In the case of an oxide layer comprising a complicated material such as a metal salt, metal alkoxide, and a metal-organic compound used in a solution process as the starting material, a process and a step of forming the thin film are complicated. Metal and a salt or alkoxide attached thereto are reacted via a hydrolysis or condensation process through a sol-gel reaction, and an organic material or an anion formed on the thin film during this process may act as a factor disturbing formation of the oxide layer or an impurity hindering an electric characteristic, and can be removed only through high temperature annealing, and thus the oxide thin film having device performance may be formed only through the high temperature annealing.

On the other hand, the metal hydroxide as the starting material proposed by the present disclosure can be dissolved under an appropriate pH condition, and form the oxide layer having the high purity without an impurity such as the organic material or the anion remaining on the thin film only through pyrolysis and dehydration at low temperatures without a complicated multi-stage reaction such as desorption and decomposition processes of an additional organic material. An appropriate acid/base titrant may be used to dissolve the metal hydroxide without using a separate stabilizer. The acid/base titrant may be contained, for example, at a concentration of about 0.05 mol/L to about 40 mol/L. Ammonia, tetramethylammonium hydroxide, methylamine, urea, an acetic acid, a hydrochloric acid, a nitric acid, a sulfuric acid, hydrogen peroxide, or a combination thereof may be used as the acid/base titrant.

FIG. 1 shows a change in solubility to various metal elements according to the degree of acidity or basicity (pH). From FIG. 1, solubility of the metal hydroxide can be controlled by chaing pH, and metal elements for metal oxides having the semiconductor, insulator, and/or conductor behavior through the solution process can be discriminated.

Further, when microwave annealing is used, mobility of atoms in the precursor of the metal elements may effectively and significantly increases to complete the reaction through promotion of dehydration, the impurity removal, and improvement of crystallinity as compared to a typical annealing method using a hot plate or an oven, and thus device performance may be improved at low temperatures.

Figure 2:
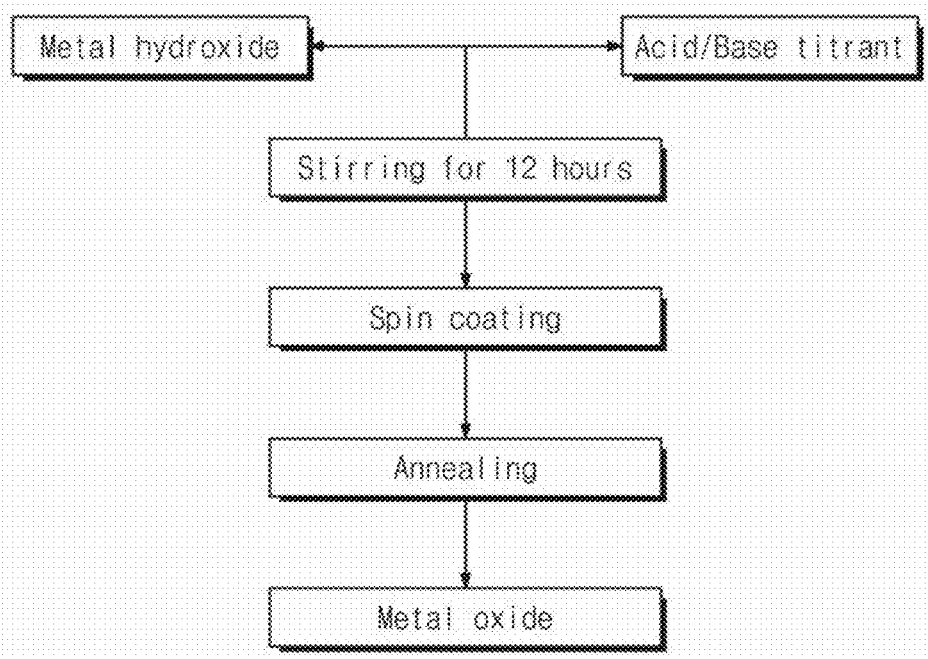
FIG. 2 is a process chart showing manufacturing steps of a metal oxide thin film according to the present disclosure.

FIG. 2 shows manufacturing steps of the metal oxide thin film according to the present disclosure. The metal hydroxide is dissolved in an aqueous or nonaqueous solvent including the acid/base titrant, and subjected to a stabilization step through stirring to manufacture a precursor solution for the metal oxide thin film.

In the present disclosure, various materials may be used as the metal hydroxide according to physical properties required in the final metal oxide. For example, a zinc oxide (ZnO) thin film may be obtained by using zinc hydroxide as the starting material of the semiconductive thin film, and an aluminum-zinc oxide (AZO), tin-zinc oxide (ZTO), gallium-tin-zinc oxide (GSZO), or indium-zinc oxide (IZO) thin film may be obtained using aluminum hydroxide, gallium hydroxide, indium hydroxide, tin hydroxide, or a combination complex material thereof as the starting material.

Further, the thin film of ZrZnO, YZnO, GaZnO, ScZnO, HfZnO, or LaZnO may be obtained by using yttrium hydroxide ($Y(OH)_3$), zirconium hydroxide ($Zr(OH)_4$), hafnium hydroxide ($Hf(OH)_4$), scandium hydroxide ($Sc(OH)_3$), gallium hydroxide ($Ga(OH)_3$), lanthanum hydroxide ($La(OH)_3$), or a combination thereof to improve bias stability.

Further, the thin film of LiZnO or TiZnO may be obtained by using lithium hydroxide (Li(OH)), titanium hydroxide (Ti(OH)), or a combination thereof to improve performance such as mobility at low temperatures.

Further, the thin film of LiZrZnO, LiYZnO, LiGaZnO, LiScZnO, LiHfZnO, or LiLaZnO may be obtained by using a combination material of the metal hydroxide for improving stability and the metal hydroxide for improving performance to obtain the high performance and high stability thin film.

The thin film of zirconia ($ZrO_2$), hafnia ($HfO_2$), alumina ($Al_2O_3$), lanthania ($La_2O_3$), gadolinia ($Gd_2O_3$), or yttria ($Y_2O_3$) manufactured by using zirconium hydroxide, hafnium hydroxide, aluminum hydroxide, lanthanum hydroxide, gadolinium hydroxide, or yttrium hydroxide as the starting material may be obtained for a dielectric thin film.

The thin film of indium-tin oxide (ITO), indium oxide ($O_2O_3$), tin oxide ($SnO_2$), or zinc-aluminum oxide (AlZnO) may be manufactured by using indium hydroxide, tin hydroxide, zinc hydroxide, aluminum hydroxide, or a combination thereof to form a conductor such as an electrode.

The acid/base titrant mixed to improve solubility of the metal hydroxide may depend on the used metal hydroxide. Specifically, ammonia, tetramethylammonium hydroxide, methylamine, urea, an acetic acid, a hydrochloric acid, a nitric acid, a sulfuric acid, and hydrogen peroxide may be used as the acid/base titrant, but the acid/base titrant may not limited thereto. Agent which can form a complex with dissolved metal ion for increasing solubility and can be decomposed at low temperature may be used. The titrant forming a complex together with dissolved metal ions to increase solubility and decomposed at low temperatures may have excellent characteristics as the more effective titrant. The acid/base titrant may be contained, for example, at a concentration of about 0.05 mol/L to about 40 mol/L.

A stirring step may continue for about 12 hours or more. The stirred solution forms a thin film or a patterned film on a substrate through spin coating or inkjet printing. After the thin film or a film pattern is formed, microwave annealing is performed to change the metal hydroxide into the metal oxide.

In an Example of the present disclosure, an annealing step was maintained in a microwave oven at annealing power of about 2 KW and a frequency of about 2.45 GHz, an annealing temperature was in the range of about 100° C. to about 400° C., and an annealing atmosphere was maintained as a vacuum or reduction atmosphere. The microwave annealing can promote a phase transfer reaction through temporal and selective heating as compared to typical annealing to be performed within a short time at low temperatures, and may be converted into various effective annealing methods such as continuous microwave annealing and microwave annealing by a pulse method. Subsequently, the obtained oxide thin film may be further subjected to second annealing in various atmosphere states at a temperature of about 100° C. to about 300° C. if necessary.

In the present disclosure, the aqueous solvent or the nonaqueous solvent may be used as a solution in which the metal hydroxide is dissolved.

The aqueous solvent may be used alone or in a state of a mixture with water, and ammonia, tetramethylammonium hydroxide, methylamine, urea, acetic acid, hydrochloric acid, nitric acid, sulfuric acid, and hydrogen peroxide aqueous solutions, or a combination thereof may be used.

Since a volatilization temperature of the aqueous solvent is lower than a temperature at which other organic components are decomposed and removed and a reaction temperature of the metal hydroxide, the aqueous solvent does not act as a remaining organic component but may be used to improve a coating property when the thin film is formed or form a trap site at a thin film interface (semiconductor-dielectric interface).

The aqueous solvent may be used alone or in a state of a mixture with water, and an ammonia aqueous solution, a hydrogen peroxide aqueous solution, or a combination thereof may be used.

The nonaqueous organic solvent may be used alone or in a state of a mixture with water, and for example, n-butyl acetate, 2-methoxy-1-methylethyl acetate (PGMEA), 1-methoxy-2-propanol (PGME), 1-propanol, and 1-butanol may be used.

Hereinafter, characteristics of the oxide thin film according to the present disclosure and availability of the oxide thin film as the semiconductor, the insulator, and the conductor will be described in detail through specific Examples.

Example 1. Manufacturing of the Zinc Oxide (ZnO) Semiconductor Thin Film

Zinc hydroxide ($Zn(OH)_2$) was used as the starting material, and since the precursor thereof has high solubility in the base, zinc hydroxide was dissolved in the ammonia aqueous solution and then stirred at a room temperature for about 12 hours to manufacture the semiconductive solution. After the substrate was spin-coated with the solution to manufacture the thin film, typical type annealing and annealing using the microwave oven were performed. Since dehydration of zinc hydroxide occurs at about 120° C., semiconductor behavior can be obtained at about 120° C. or more. The oxide thin film transistor having the excellent semiconductor behavior was obtained at the same temperature as typical annealing by the microwave oven.

The thin film transistor having the bottom gate/top contact structure was formed by using the zinc oxide thin film obtained after annealing.

Figure 3:
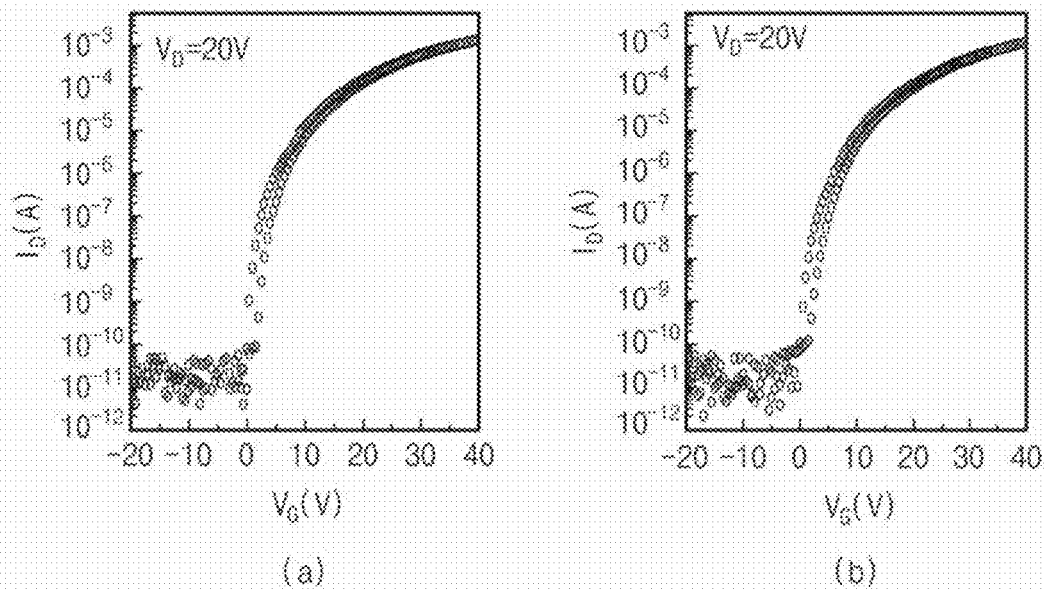
FIGS. 3(a) to 3(c) are graphs showing a thin film transistor transfer characteristic of a zinc oxide thin film formed through Example 1 of the present disclosure according to a annealing temperature.
Figure 3:
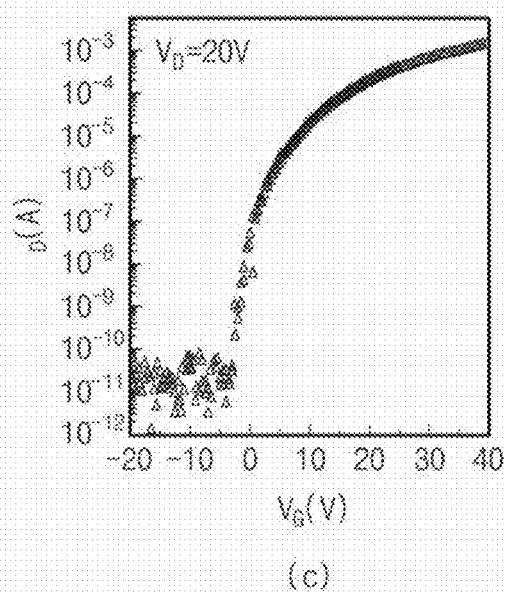

FIGS. 3A to 3C are graphs showing a transfer characteristic (transfer curve) of the thin film transistor according to the annealing temperature (FIG. 3A: about 140° C., FIG. 3B: about 220° C., and FIG. 3C: about 320° C.) of the zinc oxide (ZnO) thin film formed through Example 1.

Each graph was obtained by performing spin coating of the $Zn(OH)_2$ solution dissolved in ammonia water, performing annealing for each annealing temperature by using the microwave oven, and measuring the transfer characteristic while $V_g$ was changed from about −40 V to about 40 V and $V_d$ was maintained at a constant value of about 20 V. The specific device characteristic value is described in the following Table 1.

The device characteristic value may be considered as the best performance at the minimum temperature based on the results reported in papers up to now.

TABLE 1

|  | Temperature | | |
| --- | --- | --- | --- |
|  | 140° C. | 220° C. | 320° C. |
| Mobility (cm²/Vs) | 1.75 | 2.75 | 5.72 |
| Threshold voltage ($V_{th}$) (V) | 8.04 | 6.7 | 2.93 |
| Subthreshold slope (V/dec) | 0.74 | 0.55 | 0.86 |
| On/off ratio | $10^7$ | $10^7$ | $10^7$ |

Example 2. Manufacturing of the $ZrO_x$ Dielectric Thin Film

Zirconium hydroxide ($Zr(OH)_4$) was used as the starting material, and since the precursor thereof has high solubility in the base, zirconium hydroxide was dissolved in the ammonia aqueous solution and then stirred at a room temperature for about 12 hours to manufacture the dielectric solution. After the substrate was spin-coated with the solution to manufacture the thin film, typical type annealing and annealing using the microwave oven were performed. The insulating behavior was obtained at about 250° C. or more. The oxide thin film having the excellent insulating characteristic was obtained at the same temperature as typical annealing by the microwave oven.

Figure 4:
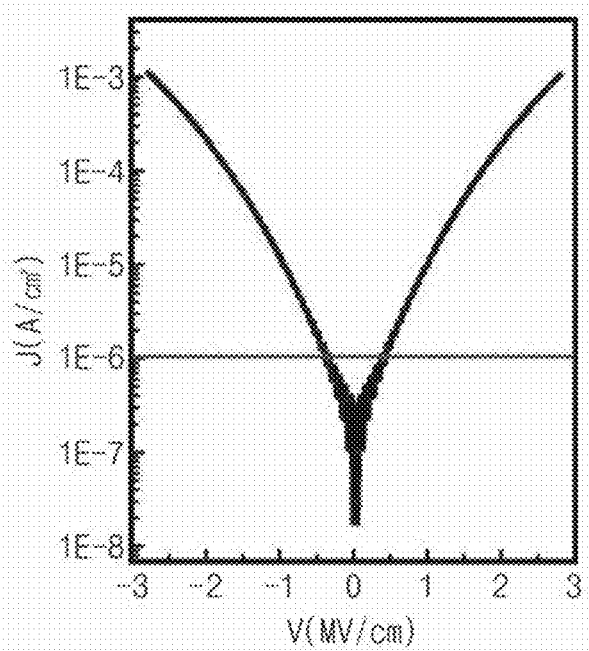
FIGS. 4(a) and 4(b), 5(a) and 5(b), 6(a) and 6(b), 7(a) and 7(b) are I-V and C-V graphs showing performance of a ZrOx insulating layer formed through Example 1 of the present disclosure according to an annealing temperature of a microwave oven.
Figure 4:
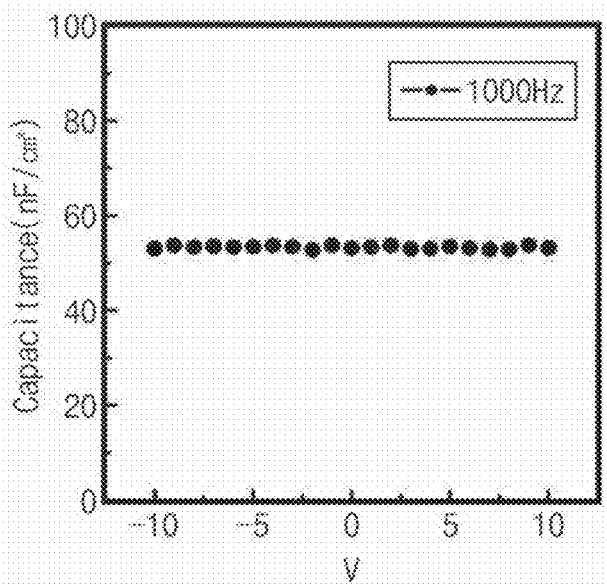
Figure 5:
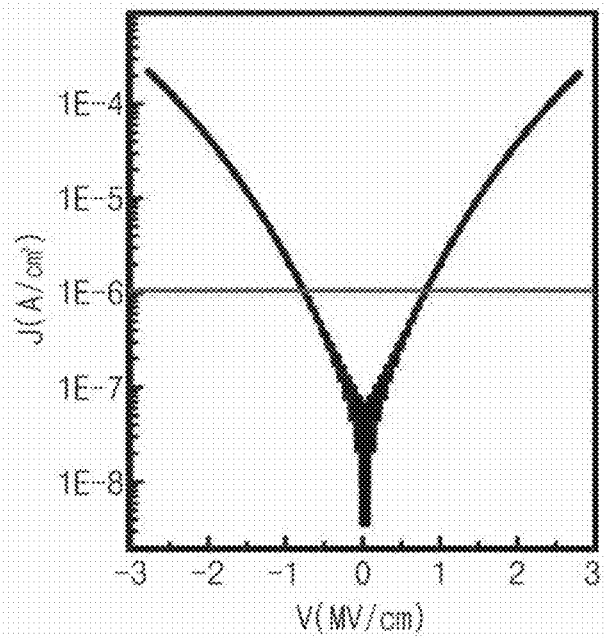
Figure 5:
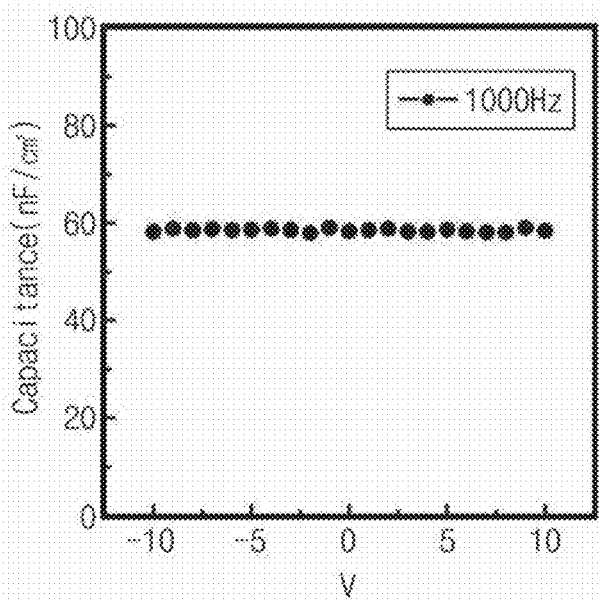
Figure 6:
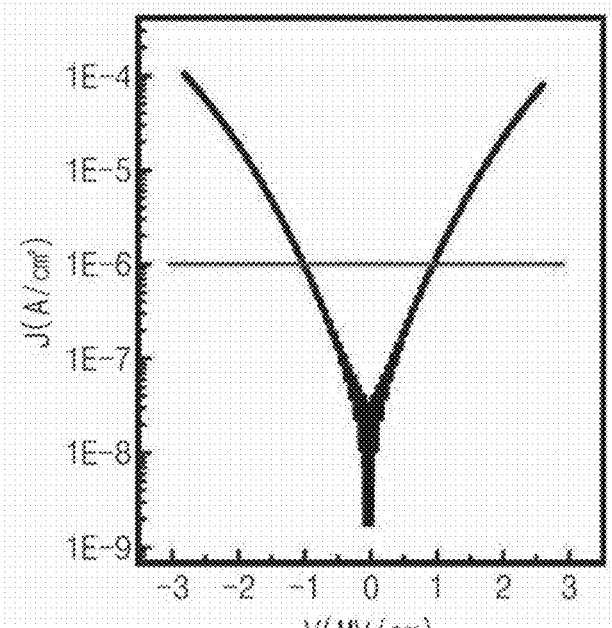
Figure 6:
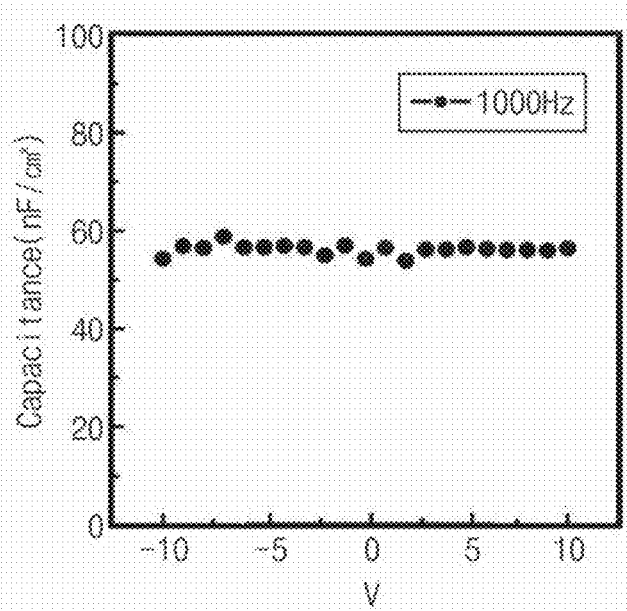
Figure 7:
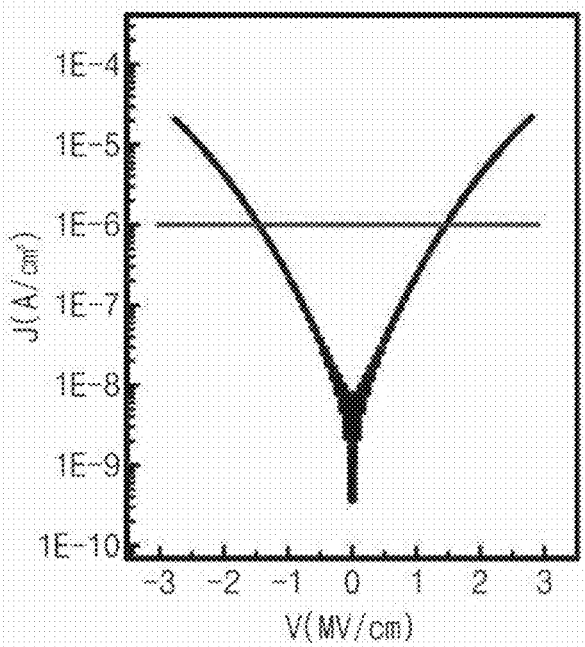
Figure 7:
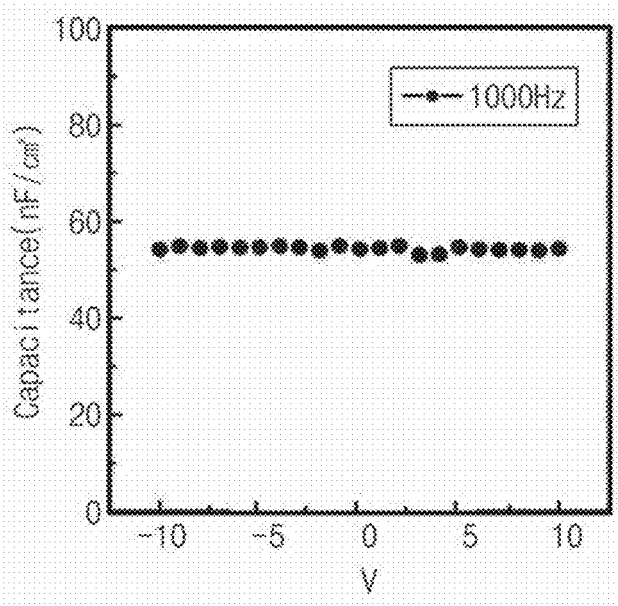

The dielectric characteristic of the zirconium oxide thin film obtained after annealing was examined FIGS. 4A to 7A and 4B to 7B are I-V and C-V graphs showing performance of the $ZrO_x$ insulating layer according to the annealing temperature of the microwave oven (FIGS. 4A and 4B: about 250° C., FIGS. 5A and 5B: about 300° C., FIGS. 6A and 6B: about 350° C., and FIGS. 7A and 7B: about 400° C.). Further, the dielectric characteristics (dielectric strength and dielectric constant) of the zirconium oxide thin film according to the annealing temperature were measured, and described in Table 2.

TABLE 2

|  | Dielectric strength (MV/cm) | Dielectric constant (K) |
| --- | --- | --- |
| 250° C. | 0.56 | 9.97 |
| 300° C. | 0.98 | 9.8 |
| 350° C. | 1.39 | 11.0 |
| 400° C. | 1.68 | 9.2 |

Example 3. Manufacturing of the Transparent Transistor Through the all Solution Process After the ITO or AZO electrode material manufactured by the solution method using the metal hydroxide starting material was applied by spin coating on the PES (polyether sulfone) substrate or the glass substrate, the dielectric solution was manufactured by the solution method using zirconium hydroxide ($Zr(OH)_4$) as the starting material and applied by spin coating to form the $ZrO_x$ dielectric layer. After the solution manufactured by using $Zn(OH)_2$ as the starting material was applied thereon by using spin coating, annealing was performed at about 140° C., and finally the ITO or AZO solution was patterned or the aluminum electrode was deposited by using the evaporation method to manufacture the transparent flexible device in which all layers were formed through the solution process.

Figure 8:
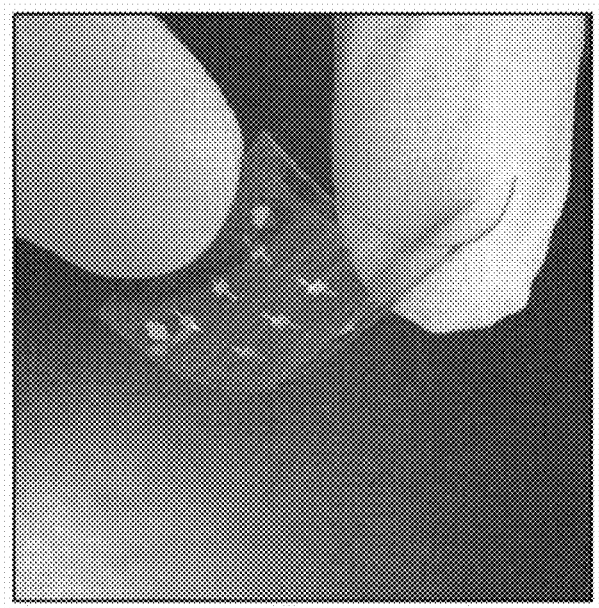
FIG. 8 is a picture showing a ZnO-based transparent thin film transistor array manufactured according to Example 1 of the present disclosure.

FIG. 8 is a picture showing the ZnO-based transparent thin film transistor array manufactured according to the present Example, and it was confirmed that the transparent device having the electric behavior similar to that of the typical vacuum deposition crystal Si-based device could be manufactured on the flexible PES substrate.

Example 4. Manufacturing of the Zirconium Zinc Oxide (ZrZnO) Semiconductor Thin Film The zinc hydroxide ($Zn(OH)_2$) and zirconium hydroxide ($Zr(OH)_4$) starting materials were used, and since the precursors thereof had solubility in the base, after zinc hydroxide was dissolved in the ammonia aqueous solution, zirconium hydroxide was further dissolved while the concentration was changed in order to improve stability. In this case, the mol ratio (atomic number ratio) of zinc and zirconium was set so that the mol number of the zirconium precursor was about 0, 0.5, 1, and 2 when the mol number of the zinc precursor was about 100. That is, the atomic number ratio of zinc to zirconium was set to be about 1:0, 1:0.005, 1:0.01, and 1:0.02.

Thereafter, stirring was performed at a room temperature for about 12 hours to manufacture a semiconductive solution. Before the aforementioned solution was subjected to spin coating, the heavily doped silicon substrate on which $SiO_2$ was formed in a thickness of about 100 nm was washed through ultrasonic wave treatment for about 5 min in the piranha solution (sulfur acid:hydroperoxide=about 4:1), and also washed by the same method sequentially using methyl alcohol, iso-propyl alcohol (IPA), ethyl alcohol, and DI-water.

After the washed substrate was dried by the IR-lamp for about 30 min to remove moisture, UV was radiated by the UV-lamp for about 1 hour to modify the surface thereof to have hydrophilicity. After the substrate was spin-coated by the solution to manufacture the thin film, annealing was performed by using the hot plate. Since dehydration of zinc hydroxide occurs at about 120° C. and dehydration of zirconium hydroxide occurs at about 250° C., semiconductor behavior can be obtained at about 250° C. or more. Zirconium hydroxide was added to allow the oxide thin film transistor to have excellent bias stability at the same temperature as the typical semiconductor manufactured only by using pure zinc hydroxide.

The thin film transistor having the bottom gate/top contact structure was formed by using the zirconium zinc oxide thin film obtained after annealing.

Figure 9:
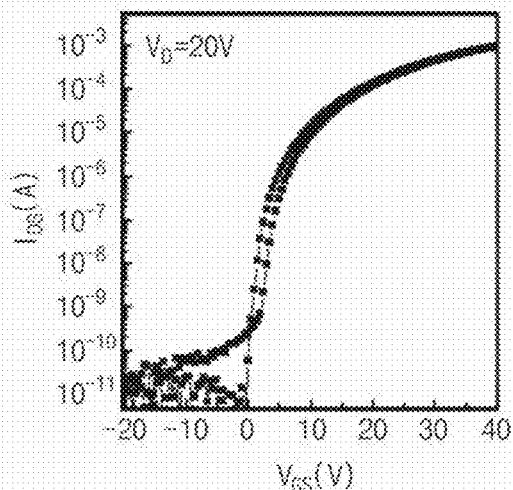
FIGS. 9(a) to 9(d) are graphs showing a thin film transistor transfer characteristic of a zirconium zinc oxide thin film formed through Example 4 of the present disclosure according to a zirconium concentration.
Figure 9:
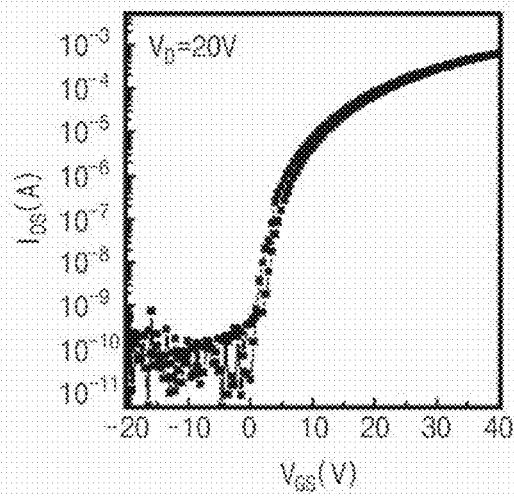
Figure 9:
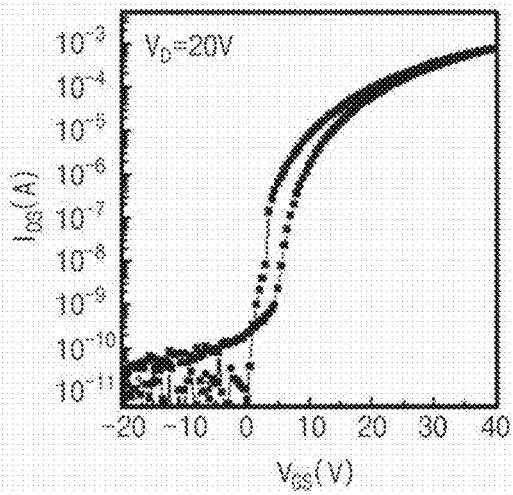
Figure 9:
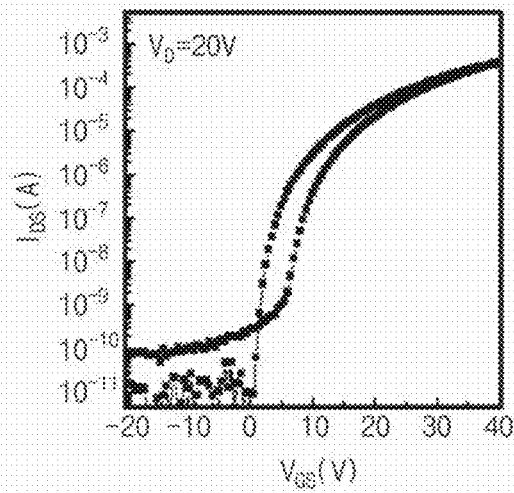
Figure 10:
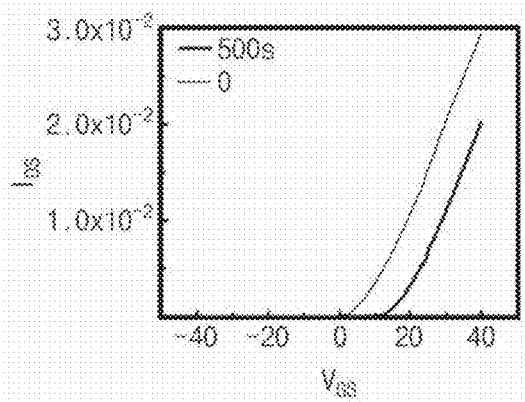
FIGS. 10(a) to 10(d) are graphs showing a change in performance of the zirconium zinc oxide thin film formed through Example 4 of the present disclosure according to a change in time for which positive bias stress is applied according to the zirconium concentration.
Figure 10:
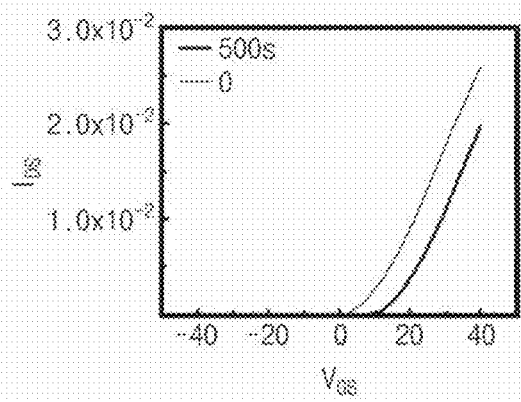
Figure 10:
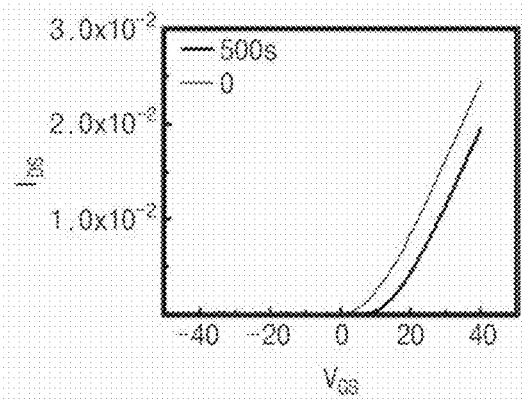
Figure 10:
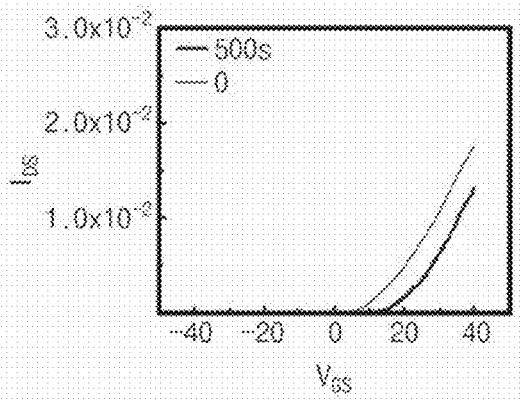

FIGS. 9A to 9D are graphs showing the thin film transistor transfer characteristic (transfer curve) of the zirconium zinc oxide (ZrZnO) thin film formed through Example 4, to which the zirconium metal element was added while the mol concentration was changed (FIG. 9A: about 0%, FIG. 9B: about 0.5%, FIG. 9C: about 1%, and FIG. 9D: about 2%).

Each graph was obtained by performing spin coating of the $Zn(OH)_2$ and $Zr(OH)_4$ solutions dissolved in ammonia water, performing annealing at about 350° C. for about 2 hours by using the hot plate, and measuring the transfer characteristic while $V_g$ was changed from about −40 V to about 40 V and $V_d$ was maintained at a constant value of about 20 V. The specific device characteristic value is described in the following Table 3.

TABLE 3

| | Zirconium doping mol ratio | | | |
|---|---|---|---|---|
| | 0% | 0.5% | 1% | 2% |
| Mobility (cm$^2$/Vs) | 2.08 | 1.82 | 1.74 | 1.23 |
| Threshold voltage (Vth) (V) | 3.7 | 4.1 | 4.5 | 7.2 |
| On/off ratio | 10$^7$ | 10$^7$ | 10$^7$ | 10$^6$ |

According to performance measurement, the pure zinc oxide thin film transistor manufactured at about 350° C. had the excellent result of mobility of about 2.08 cm$^2$/Vs, and excellent operation characteristics of the operation voltage of about 4.1 V and the on/off ratio of about 107. Accordingly, it was confirmed that the semiconductor layer having the excellent operation characteristics could be manufactured through the solution process. However, it was confirmed that mobility was slightly reduced when zirconium metal ions were added.

Further, FIGS. 10A to 10D illustrate a change in device performance according to bias stress when the gate voltage is applied to the ZnO semiconductor layer manufactured through Example 4 and the semiconductor layer having the ZrZnO composition manufactured by adding the Zr element for about 500 sec. It could be confirmed that in the case of the ZrZnO thin film including zirconium, the threshold voltage was not significantly increased but stable, and in the case of the ZnO thin film to which zirconium was not added, the threshold voltage was increased as bias stress was applied.

In the following Table 4, a change in threshold voltage is described, and in the case of the ZrZnO thin film, unlike ZnO, even though bias stress is applied, the threshold voltage is hardly changed and has the low numerical value.

TABLE 4

| Zirconium doping mol ratio | Change in threshold voltage ($\Delta V_{th}$) |
|---|---|
| 0% | ~12 V |
| 0.5% | ~8 V |
| 1% | ~4.6 V |
| 2% | ~4.8 V |

Further, the test was performed by the aforementioned method in order to confirm whether the change in threshold voltage was reduced due to addition of the zirconium ions even when bias stress was applied in the transistor manufactured at about 250° C. as the temperature at which the ZrZnO thin film could be formed in order to confirm improvement of stability during the low temperature process, resulting in the confirmation that the change in threshold voltage was reduced and then saturated as shown in Table 5. That is, it can be confirmed that stability of the device is improved due to addition of zirconium.

TABLE 5

| Zirconium doping mol ratio | Change in threshold voltage ($\Delta V_{th}$) |
|---|---|
| 0% | ~13.1 V |
| 0.5% | ~9.2 V |
| 1% | ~5.2 V |
| 2% | ~6.7 V |

Example 5. Manufacturing of the Semiconductor Thin Film of the Yttrium Zinc Oxide (YZnO) Thin Film Having High Stability Through Yttrium Doping The zinc hydroxide (Zn(OH)$_2$) and yttrium hydroxide (Y(OH)$_3$) starting materials were used, and since the precursors thereof had solubility in the base, after zinc hydroxide was dissolved in the ammonia aqueous solution, yttrium hydroxide was further dissolved in order to improve stability. In this case, the mol ratio (atomic number ratio) of zinc and yttrium was set so that the mol number of the yttrium precursor was about 0, 0.5, 1, and 2 when the mol number of the zinc precursor was about 100. Thereafter, stirring was performed at a room temperature for about 12 hours to manufacture a semiconductive solution. The substrate was treated by the same test method as the method described in Example 4 and then spin-coated with the solution to manufacture the thin film, and annealing was then performed by using the hot plate. Since dehydration of zinc hydroxide occurs at about 120° C. and dehydration of yttrium hydroxide occurs at about 280° C., semiconductor behavior can be obtained at about 300° C. or more. Yttrium hydroxide was added to allow the oxide thin film transistor to have excellent positive bias stability at the same temperature as the typical semiconductor manufactured only by using pure zinc hydroxide. Further, the oxide thin film transistor having high stability under negative bias and thermal stress could be embodied.

The thin film transistor having the bottom gate/top contact structure was formed by using the yttrium zinc oxide thin film obtained after annealing.

Figure 11:
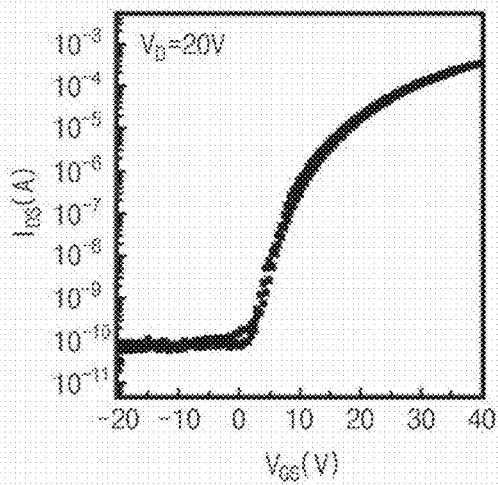
FIGS. 11(a) to 11(c) are graphs showing a thin film transistor transfer characteristic of a yttrium zinc oxide thin film formed through Example 5 of the present disclosure according to a yttrium concentration.
Figure 11:
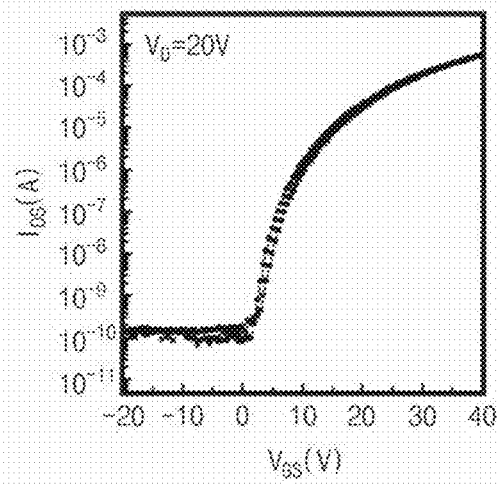
Figure 11:
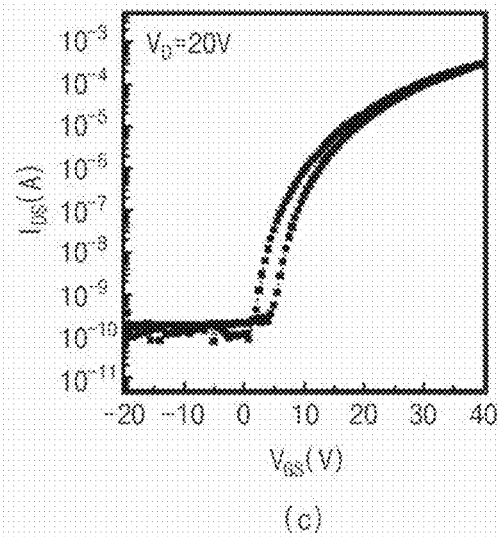

FIGS. 11A to 11C are graphs showing the thin film transistor transfer characteristic (transfer curve) of the yttrium zinc oxide (YZnO) thin film formed through Example 5, to which the yttrium metal element was added while the mol concentration was changed (FIG. 11A: about 0.5%, FIG. 11B: about 1%, and FIG. 11C: about 2%).

Each graph was obtained by performing spin coating of the Zn(OH)$_2$ and Y(OH)$_3$ solutions dissolved in ammonia water, performing annealing at about 350° C. by using the hot plate, and measuring the transfer characteristic while $V_g$ was changed from about −40 V to about 40 V and $V_d$ was maintained at a constant value of about 20 V. The specific device characteristic value is described in the following Table 6.

According to performance measurement, the transistor of the yttrium zinc (YZnO) thin film having the yttrium metal element mol concentration of about 0.5% had the excellent result of mobility of about 1.93 cm$^2$/Vs, and excellent operation characteristics of the operation voltage of about 3.9 V and the on/off ratio of about 107. Accordingly, it was confirmed that the semiconductor layer having the excellent operation characteristics could be manufactured through the solution process. However, it was confirmed that when yttrium metal ions were added, like the case of addition of zirconium in Example 4, mobility was slightly reduced.

TABLE 6

| | Yttrium doping mol ratio | | | |
|---|---|---|---|---|
| | 0% | 0.5% | 1% | 2% |
| Mobility (cm$^2$/Vs) | 2.08 | 1.93 | 1.81 | 1.21 |
| Threshold voltage (V) | 3.7 | 3.9 | 4.1 | 8.2 |

Figure 12:
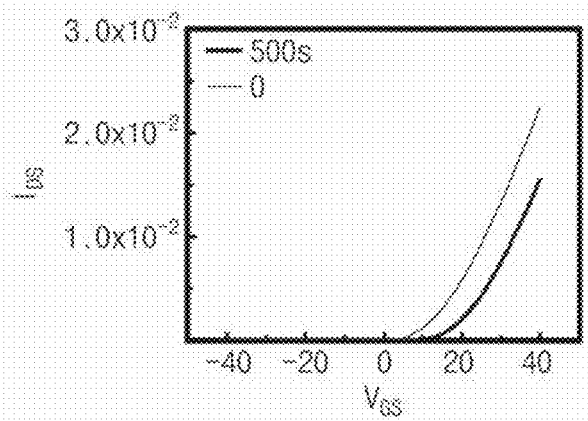
FIGS. 12(a) to 12(c) are graphs showing a change in performance of the yttrium zinc oxide thin film formed through Example 5 of the present disclosure according to a change in time for which positive bias stress is applied according to the yttrium concentration.
Figure 12:
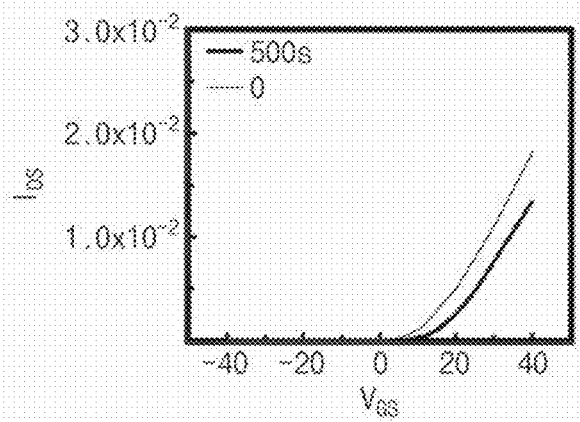
Figure 12:
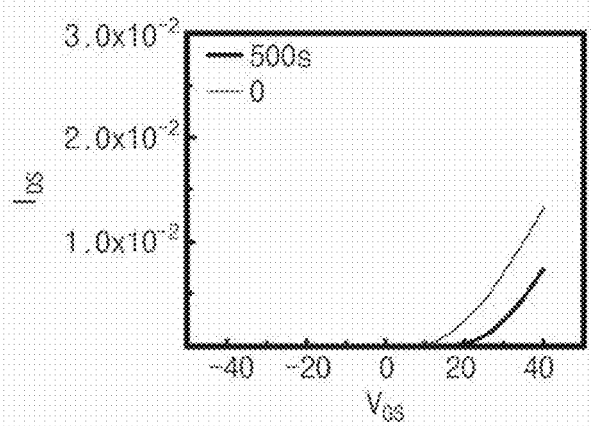

Further, FIGS. 12A to 12C illustrate a change in device performance according to bias stress when the gate voltage is applied to the ZnO semiconductor layer manufactured through Example 2 and the semiconductor layer having the YZnO composition manufactured by adding the Y element for about 500 sec. It was confirmed that in the case of the YZnO thin film including yttrium, the threshold voltage was not significantly increased but stable similarly to the device, to which the zirconium metal element was added, used in Example 4. In Table 7, a change amount in threshold voltage is described, and in the case of the YZnO thin film, unlike ZnO, even though bias stress is applied, the threshold voltage is hardly changed and has the low numerical value.

TABLE 7

| Yttrium doping mol ratio | Change in threshold voltage ($\Delta V_{th}$) |
|---|---|
| 0% | ~12 V |
| 0.5% | ~4.3 V |
| 1% | ~3.87 V |
| 2% | ~5.98 V |

Further, the test was performed by the aforementioned method in order to confirm whether the change amount in threshold voltage was reduced due to addition of the yttrium ions even when bias stress was applied in the transistor manufactured at about 300° C. as the temperature at which the YZnO thin film could be formed in order to confirm improvement of stability during the low temperature process, resulting in the confirmation that the change amount in threshold voltage was reduced and then increased as shown in Table 8. That is, it can be confirmed that stability of the device is improved due to addition of the yttrium ions.

TABLE 8

| Yttrium doping mol ratio | Change in threshold voltage ($\Delta V_{th}$) |
|---|---|
| 0% | ~12.6 V |
| 0.5% | ~6.3 V |
| 1% | ~4.87 V |
| 2% | ~8.1 V |

Figure 13:
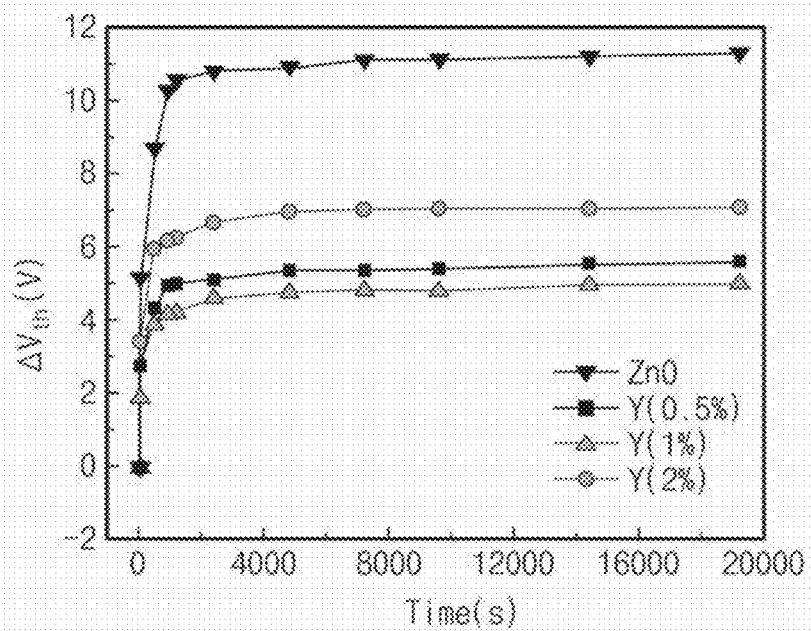
FIG. 13 is a graph showing comparison of changes in threshold voltage to the yttrium zinc oxide thin film formed through Example 5 of the present disclosure as time passes.

In FIG. 13, it can be confirmed that a change in threshold voltage according to a change in each time is shown, and in the case of the YZnO thin film, even though positive bias is applied for a long time, the threshold voltage is hardly changed and has the low numerical value, but in the case of the ZnO thin film to which yttrium is not added, the threshold voltage is increased as positive bias stress is applied.

Figure 14:
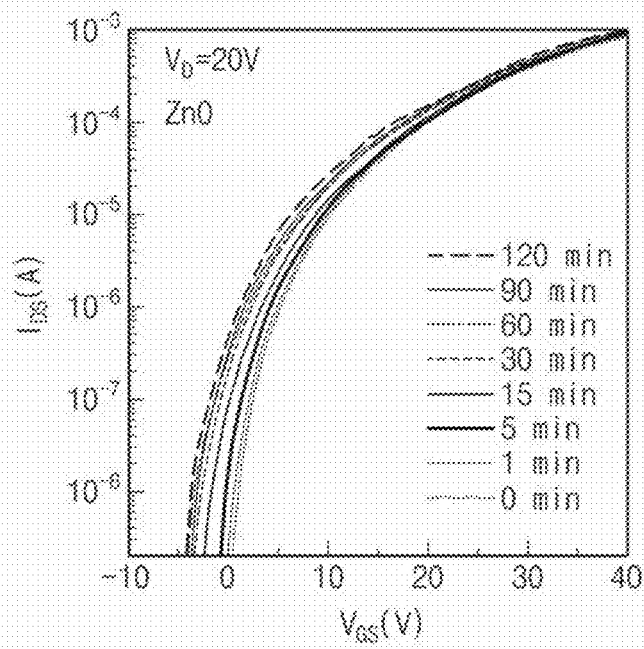
FIGS. 14(a) and 14(b) are graphs showing a change in threshold voltage to the yttrium zinc oxide thin film formed through Example 5 of the present disclosure according to a time for which negative bias stress and thermal stress are applied.
Figure 14:
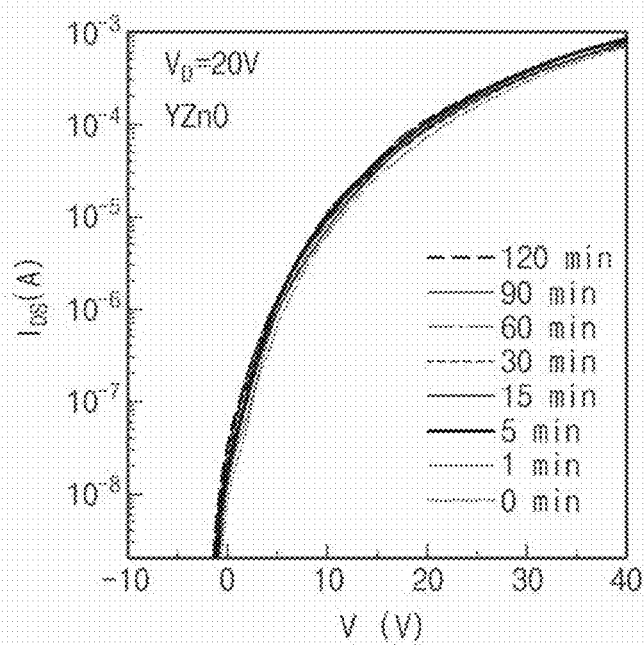

Further, negative bias and thermal stress were applied to the semiconductor layers having two compositions for about two hours, and the resulting change is shown in FIGS. 14A and 14B. It could be confirmed that in the case of the YZnO (FIG. 14B) thin film including yttrium, the threshold voltage was hardly changed but stable, and in the case of the ZnO (FIG. 14a) thin film to which yttrium was not added, the threshold voltage was reduced as negative bias and thermal stress were applied.

Example 6. Manufacturing of the Lithium Zinc Oxide (LiZnO) Semiconductor Thin Film Having High Performance Through Lithium Doping The zinc hydroxide ($Zn(OH)_2$) and lithium hydroxide (Li(OH)) starting materials were used, and since the precursors thereof had solubility in the base, after zinc hydroxide was dissolved in the ammonia aqueous solution, lithium hydroxide was further dissolved in order to improve stability. In this case, the mol ratio (atomic number ratio) of zinc and lithium was set so that the mol number of the lithium precursor was about 0, 0.5, 1, and 2 when the mol number of the zinc precursor was about 100. Thereafter, stirring was performed at a room temperature for about 12 hours to manufacture a semiconductive solution. The substrate was treated like Example 4 and then spin-coated with the solution to manufacture the thin film, and annealing was then performed by using the hot plate. Since dehydration of zinc hydroxide occurs at about 120° C. and dehydration of lithium hydroxide occurs at about 300° C., semiconductor behavior can be obtained at about 300° C. or more. Lithium hydroxide was added to allow the oxide thin film transistor to have excellent semiconductive behavior at the same temperature as the typical semiconductor manufactured only by using pure zinc hydroxide.

The thin film transistor having the bottom gate/top contact structure was formed by using the lithium zinc oxide (LiZnO) thin film obtained after annealing.

Figure 15:
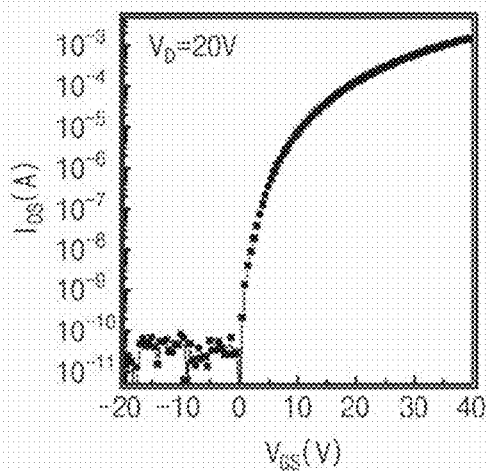
FIGS. 15(a) to 15(b) are graphs showing a thin film transistor transfer characteristic of a lithium zinc oxide thin film formed through Example 6 of the present disclosure according to a lithium concentration.
Figure 15:
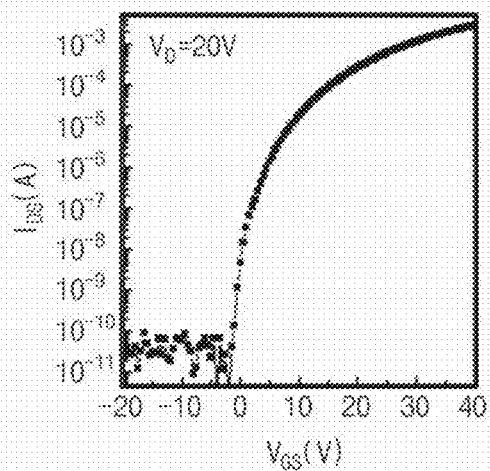
Figure 15:
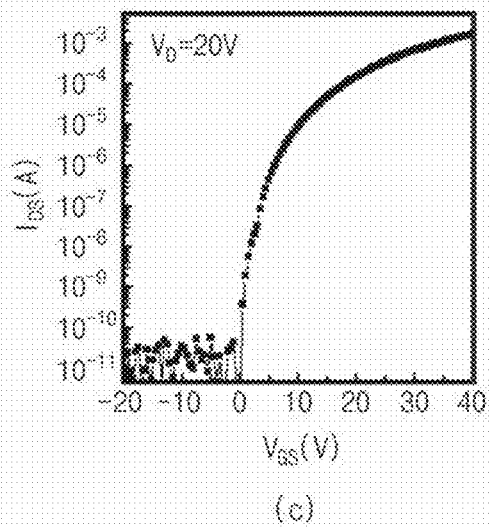

FIGS. 15A to 15C are graphs showing the thin film transistor transfer characteristic (transfer curve) of the lithium zinc oxide (LiZnO) thin film formed through Example 6, to which the lithium metal element was added while the mol concentration was changed (FIG. 15A: about 0.5%, FIG. 15B: about 1%, and FIG. 15C: about 2%).

Each graph was obtained by performing spin coating of the $Zn(OH)_2$ and Li(OH) solutions dissolved in ammonia water, performing annealing at about 350° C. by using the hot plate, and measuring the transfer characteristic while $V_g$ was changed from about −40 V to about 40 V and $V_d$ was maintained at a constant value of about 20 V. The specific device characteristic value is described in the following Table 9.

TABLE 9

| | Lithium doping mol ratio | | | |
|---|---|---|---|---|
| | 0% | 0.5% | 1% | 2% |
| Mobility ($cm^2/Vs$) | 2.08 | 4.7 | 10.5 | 4.68 |
| Threshold voltage (Vth) (V) | 3.7 | 2.9 | 1.2 | 3.1 |
| On/off ratio | $10^7$ | $10^8$ | $10^8$ | $10^8$ |

According to performance measurement, the transistor of the lithium zinc (LiZnO) thin film having the lithium metal element mol concentration of about 1% had the excellent result of mobility of about 10.5 $cm^2/Vs$, and excellent operation characteristics of the operation voltage of about 1.2 V and the on/off ratio of about 108. Accordingly, it was confirmed that the semiconductor layer having the excellent operation characteristics could be manufactured through the solution process. Further, it could be confirmed that mobility and the on/off current ratio were significantly increased and then reduced as the lithium ions were added.

Further, the test is performed by the aforementioned method in order to confirm whether mobility and the on/off current ratio are improved due to addition of the lithium ions in the transistor manufactured at about 300° C. as the temperature at which the LiZnO thin film can be formed in order to confirm improvement of mobility during the low temperature process, resulting in the confirmation that excellent results of mobility of about 3.22 $cm^2/Vs$, the operation voltage of about 11.28 V, and the on/off ratio of about 107 are secured in the transistor of the lithium zinc (LiZnO) thin film having the lithium metal element mol concentration of about 1% as compared to the zinc (ZnO) thin film but the effect is low as compared to the case of 350° C. as shown in Table 10.

TABLE 10

| | Lithium doping mol ratio | | | |
| --- | --- | --- | --- | --- |
| | 0% | 0.5% | 1% | 2% |
| Mobility (cm$^2$/Vs) | 1.87 | 2.34 | 3.22 | 2.94 |
| Threshold voltage (Vth) (V) | 11.41 | 8.95 | 11.28 | 12.09 |
| On/off ratio | 10$^7$ | 10$^7$ | 10$^7$ | 10$^7$ |

Example 7. Manufacturing of the Zirconium Lithium Zinc Oxide (ZrLiZnO) Semiconductor Thin Film Having High Performance and High Stability Through Lithium and Zirconium Doping Zinc hydroxide (Zn(OH)$_2$), zirconium hydroxide (Zr(OH)$_4$), and lithium hydroxide (Li(OH)) were used as starting materials, and since the precursors thereof had solubility in the base, after zinc hydroxide was dissolved in the ammonia aqueous solution, zirconium hydroxide was further dissolved in order to improve stability and lithium hydroxide was further dissolved in order to improve performance. In this case, the mol ratio (atomic number ratio) of zinc, zirconium, and lithium was set so that the mol number of the zirconium precursor was about 1 and the mol number of the lithium precursor was about 0.5 when the mol number of the zinc precursor was about 100. That is, the mol ratio (atomic number ratio) of zinc, zirconium, and lithium was set to be about 1:0.01:0.005.

Thereafter, stirring was performed at a room temperature for about 12 hours to manufacture a semiconductive solution. The substrate was treated by the same method as in Example 4. After the substrate was spin-coated by the solution to manufacture the thin film, annealing was performed by using the hot plate. Since dehydration of zinc hydroxide occurs at about 120° C., dehydration of lithium hydroxide occurs at about 300° C., and dehydration of zirconium hydroxide occurs at about 250° C., semiconductor behavior can be obtained at about 300° C. or more. Lithium and zirconium hydroxides were added to allow the oxide thin film transistor to have excellent semiconductive behavior and high stability at the same temperature as the typical semiconductor manufactured only by using pure zinc hydroxide.

The thin film transistor having the bottom gate/top contact structure was formed by using the lithium zinc oxide (ZrLiZnO) thin film obtained after annealing at about 350° C., about 300° C., and about 250° C. in order to confirm the effect due to addition of lithium hydroxide and zirconium hydroxide during the low temperature process.

Figure 16:
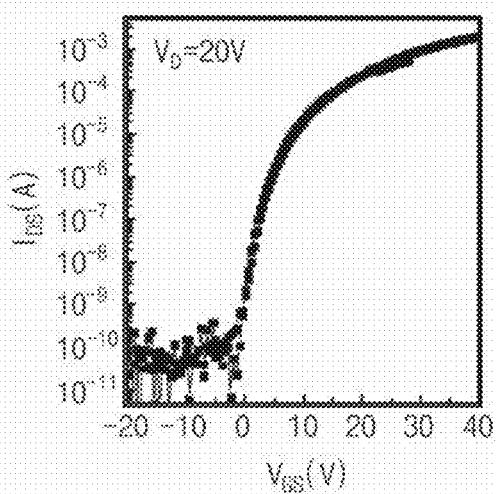
FIGS. 16(a) to 16(c) are graphs showing thin film transistor transfer characteristics of lithium and zirconium zinc oxide thin films formed through Example 7 of the present disclosure.
Figure 16:
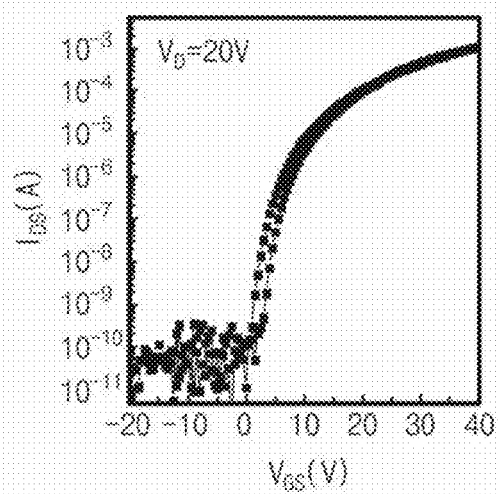
Figure 16:
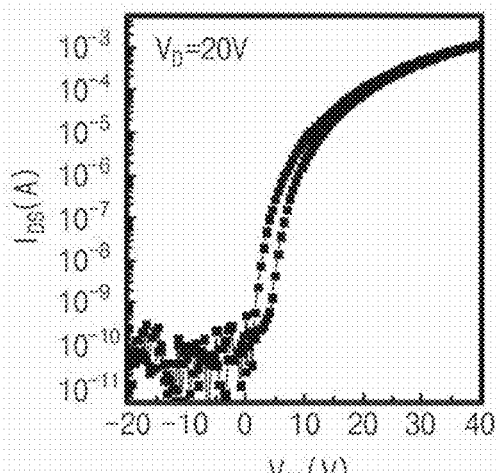

FIGS. 16A to 16C are graphs showing the thin film transistor transfer characteristic (transfer curve) of the zirconium lithium zinc oxide (ZrLiZnO) thin film formed through Example 7 according to addition of zirconium and lithium metal elements for each annealing temperature (FIG. 16A: about 350° C., FIG. 16B: about 300° C., and FIG. 16C: about 250° C.). Each graph was obtained by performing spin coating of the Zn(OH)$_2$, Li(OH), and Zr(OH)$_4$ solutions dissolved in ammonia water, performing annealing at each temperature for about 2 hours by using the hot plate, and measuring the transfer characteristic while V$_g$ was changed from about −40 V to about 40 V and V$_d$ was maintained at a constant value of about 20 V. The specific device characteristic value is described in the following Table 11.

TABLE 11

| | Annealing temperature | Mobility (cm$^2$/Vs) | Threshold voltage V$_{th}$ (V) | On/off ratio |
| --- | --- | --- | --- | --- |
| ZnO | 350° C. | 2.08 | 3.7 | 10$^7$ |
| ZnO | 300° C. | 1.87 | 11.41 | 10$^7$ |
| ZnO | 250° C. | 0.89 | 12.4 | 10$^7$ |
| ZrLiZnO | 350° C. | 5.69 | 1.7 | 10$^7$ |
| ZrLiZnO | 300° C. | 3.2 | 8.7 | 10$^7$ |
| ZrLiZnO | 250° C. | 2.87 | 9.8 | 10$^7$ |

According to performance measurement, the zirconium lithium zinc (LiZnO) thin film transistor annealed at about 350° C. had the excellent result of mobility of about 10.5 cm$^2$/Vs, and excellent operation characteristics of the operation voltage of about 1.2 V and the on/off ratio of about 108. It could be confirmed that when the zirconium metal ions described in Example 4 were added, mobility was not slightly reduced, and when the lithium ions were added, device performance was increased as compared to the pure oxide semiconductor of zinc oxide. It can be confirmed that in the case of the zirconium lithium zinc (LiZnO) thin film transistor annealed at about 300° C., a reduction in device performance according to addition of the zirconium metal ions is supplemented according to addition of the lithium metal ions, and thus improvement of device performance is maintained as compared to the pure oxide semiconductor of zinc oxide but the degree of improvement of performance is low as compared to the case of about 350° C.

Figure 17:
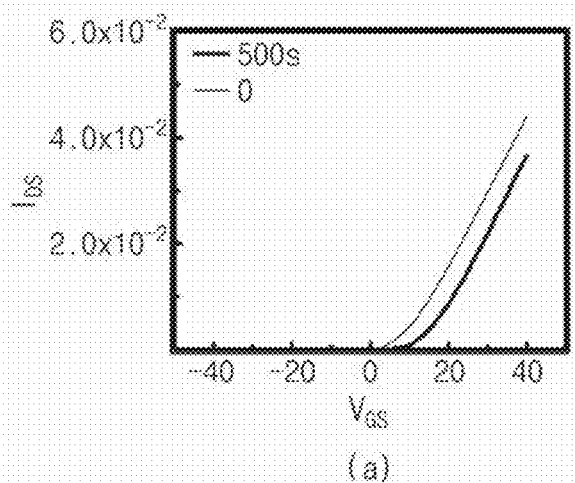
FIGS. 17(a) to 17(c) are graphs showing a change in performance of the lithium and zirconium zinc oxide thin films formed through Example 7 of the present disclosure according to a change in time for which positive bias stress is applied.
Figure 17:
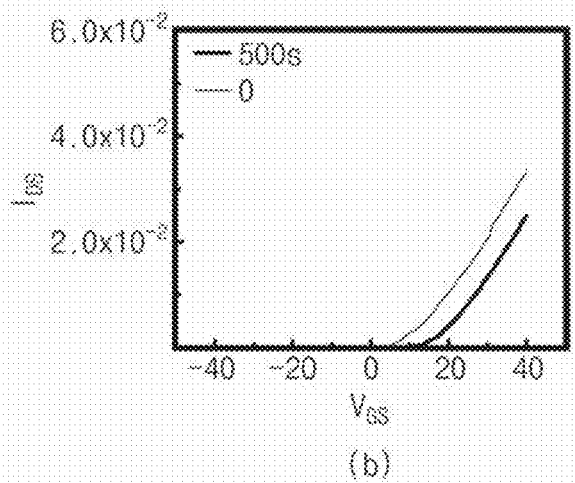
Figure 17:
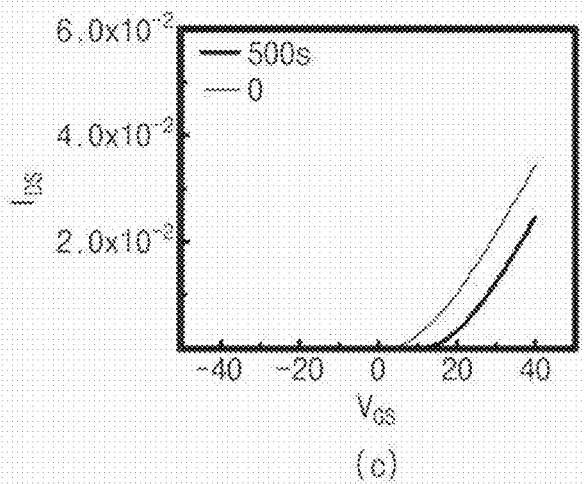

Further, FIG. 17A (350° C.), FIG. 17B (300° C.), and FIG. 17C (250° C.) show a change in device performance according to bias stress when the gate voltage is applied to the ZnO semiconductor layer manufactured through Example 1 and the semiconductor layer having the LiZrZnO composition manufactured by adding the Li and Zr elements through Example 7 for about 500 sec. In Table 12, a change amount in threshold voltage is described, and in the case of the YZnO thin film, unlike ZnO, even though bias stress is applied, the threshold voltage is hardly changed and has the low numerical value.

TABLE 12

| | ZnO | ZrLiZnO | ZnO | ZrLiZnO |
| --- | --- | --- | --- | --- |
| Annealing temperature | 350° C. | 350° C. | 300° C. | 300° C. |
| Change in threshold voltage | ~12 V | ~4.1 V | ~12.6 V | ~6.1 V |

It can be confirmed that in the case of the LiZrZnO thin film including lithium and zirconium annealed at about 350° C., a change in threshold voltage is about 4.1 V, which is not significantly increased, and stable, but in the case of the ZnO thin film to which lithium and zirconium are not added, the change in threshold voltage is significantly increased to about 12 V and thus unstable as bias stress is applied. It can be confirmed that this tendency is maintained even in the case of the LiZrZnO thin film annealed at about 300° C.

The metal oxide thin film according to the present disclosure may be applied to thin film transistors having various structures, for example, all of bottom gate-bottom contact, bottom gate-top contact, top gate-top contact, and top gate-bottom contact structures, and used in various electronic devices, optical devices, and sensors using the thin film.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

INDUSTRIAL APPLICABILITY

The present disclosure relates to a metal oxide thin film and a method for manufacturing the same and, in detail, proposes a solution for a metal oxide thin film used to implement high mobility, excellent operation stability and reproducibility when an electric field is applied, and a transparent electronic device at about 350° C. or less so as to be applied to a plastic substrate by using low temperature annealing, a metal oxide thin film transistor formed using the same, and a method for manufacturing the same.

The present disclosure can be applied to a large-area glass substrate, a plastic substrate, and a flexible substrate.

The invention claimed is:

1. A composition for an oxide film, the composition comprising:
    a metal hydroxide; and
    an acid or base titrant for controlling solubility of the metal hydroxide,
    wherein the metal hydroxide comprises:
        a first metal hydroxide selected from aluminum hydroxide ($Al(OH)_3$), zinc hydroxide ($Zn(OH)_2$), gallium hydroxide ($Ga(OH)_3$), iridium hydroxide ($In(OH)_3$), tin hydroxide ($Sn(OH)_4$) and a combination thereof; and
        a second metal hydroxide selected from lithium hydroxide ($Li(OH)$), titanium hydroxide ($Ti(OH)$) and a combination thereof;
    wherein the first to metal hydroxide has a total concentration of about 0.05 to about 10 mol/L.

2. The composition of claim 1, wherein the metal hydroxide further comprises a third metal hydroxide selected from yttrium hydroxide ($Y(OH)_3$), zirconium hydroxide ($Zr(OH)_4$), hafnium hydroxide ($Hf(OH)_4$), scandium hydroxide ($Sc(OH)_3$), gallium hydroxide ($Ga(OH)_3$), lanthanum hydroxide ($La(OH)_3$), and a combination thereof to improve bias stability.

3. The composition of claim 2, wherein the first metal hydroxide and the third metal hydroxide are present at a mol ratio of about 1:0 to 0.2.

4. The composition of claim 3, wherein the first metal hydroxide and the third metal hydroxide are present at a mol ratio of about 1:0 to 0.02.

5. The composition of claim 2, wherein the acid or base titrant is selected from ammonia, tetramethylammonium hydroxide, methylamine, urea, an acetic acid, a hydrochloric acid, a nitric acid, a sulfuric acid, hydrogen peroxide, and a combination thereof.

6. The composition of claim 2, wherein the first metal hydroxide, the third metal hydroxide, and the second metal hydroxide are present at a mol ratio of about 1:0 to 0.2:0 to 0.2.

7. The composition of claim 6, wherein the first metal hydroxide is zinc hydroxide ($Zn(OH)_2$).

8. The composition of claim 6, wherein the acid or base titrant is selected from ammonia, tetramethylammonium hydroxide, methylamine, urea, an acetic acid, a hydrochloric acid, a nitric acid, a sulfuric acid, hydrogen peroxide, and a combination thereof.

9. The composition of claim 1, wherein the acid or base titrant is selected from ammonia, tetramethylammonium hydroxide, methylamine, urea, an acetic acid, a hydrochloric acid, a nitric acid, a sulfuric acid, hydrogen peroxide, and a combination thereof.

10. The composition of claim 9, wherein the first metal hydroxide and the second metal hydroxide are present at a mol ratio of about 1:0 to 0.2.

11. The composition of claim 10, wherein the first metal hydroxide and the second metal hydroxide are present at a mol ratio of about 1:0 to 0.02.

12. The composition of claim 1, wherein the metal hydroxide further comprises a third metal hydroxide selected from zirconium hydroxide ($Zr(OH)_4$), hafnium hydroxide ($Hf(OH)_4$), aluminum hydroxide ($Al(OH)_3$), yttrium hydroxide ($Y(OH)_3$), gadolinium hydroxide ($Gd(OH)_3$), lanthanum hydroxide ($La(OH)_3$), and a combination thereof.

13. The composition of claim 12, wherein the acid or base titrant is selected from ammonia, tetramethylammonium hydroxide, methylamine, urea, an acetic acid, a hydrochloric acid, a nitric acid, a sulfuric acid, hydrogen peroxide, and a combination thereof.

14. The composition of claim 1, wherein the first metal hydroxide is selected from zinc hydroxide ($Zn(OH)_2$), indium hydroxide ($In(OH)_3$), tin hydroxide ($Sn(OH)_4$), aluminum hydroxide ($Al(OH)_3$), and a combination thereof.

15. A method for forming an oxide film, the method comprising:
    applying the composition of claim 1 on a substrate; and
    annealing the substrate on which the composition is applied.

16. The method of claim 15, wherein the annealing is performed in a vacuum or reduction atmosphere at about 100° C. to about 350° C.

17. The method of claim 15, wherein the substrate is a flexible substrate, a transparent substrate, or a glass substrate.

18. The method of claim 15, wherein the annealing is performed using a hot plate, a convection oven, a box furnace, or a microwave.

19. A metal oxide film formed by applying the composition of claim 1 on a substrate and performing annealing.

20. The metal oxide thin film of claim 19, wherein the substrate is a flexible substrate, a transparent substrate, or a glass substrate.

21. The metal oxide thin film of claim 19, wherein the metal oxide thin film is used as an active layer of a thin film transistor.

22. A composition for an oxide film, the composition comprising:
    a first metal hydroxide selected from aluminum hydroxide ($Al(OH)_3$), zinc hydroxide ($Zn(OH)_2$), gallium hydroxide ($Ga(OH)_3$), indium hydroxide ($In(OH)_3$), tin hydroxide ($Sn(OH)_4$) and a combination thereof;
    a second metal hydroxide selected from yttrium hydroxide ($Y(OH)_3$), zirconium hydroxide ($Zr(OH)_4$), hafnium hydroxide ($Hf(OH)_4$), scandium hydroxide ($Sc(OH)_3$), gallium hydroxide ($Ga(OH)_3$), lanthanum hydroxide ($La(OH)_3$), and a combination thereof;
    a third metal hydroxide selected from lithium hydroxide ($Li(OH)$), titanium hydroxide ($Ti(OH)$), and a combination thereof; and wherein the first to third metal hydroxide has a total concentration of about 0.05 mol/L to about 10 mol/L.

23. The composition of claim 22, wherein the first metal hydroxide, the metal hydroxide, and the third metal hydroxide are contained at a mol ratio of about 1:0 to 0.2:0 to 0.2.

24. The composition of claim 23, wherein the first metal hydroxide, the metal hydroxide, and the third metal hydroxide are contained at a mol ratio of about 1:0 to 0.02:0 to 0.02.

25. The composition of claim 22, wherein the acid or base titrant is selected from ammonia, tetramethylammonium hydroxide, methylamine, urea, an acetic acid, a hydrochloric acid, a nitric acid, a sulfuric acid, hydrogen peroxide, and a combination thereof.

26. The composition of claim 25, wherein the acid or base titrant is included in a concentration of about 0.05 mol/L to about 40 mol/L.

27. A method for forming a semiconductor device, the method comprising:
    applying the composition of claim 1 on a substrate and annealing the substrate to form a semiconductor thin film;
    applying the composition of claim 12 on the semiconductor thin film and annealing the semiconductor thin film to form an insulating thin film; and
    applying the composition of claim 14 on the insulating thin film and annealing the insulating thin film to form a conductive thin film.

* * * * *